US008143668B2

(12) United States Patent
Morita et al.

(10) Patent No.: US 8,143,668 B2
(45) Date of Patent: Mar. 27, 2012

(54) SIGE MOSFET SEMICONDUCTOR DEVICE WITH SLOPED SOURCE/DRAIN REGIONS

(75) Inventors: Yusuke Morita, Akishima (JP); Ryuta Tsuchiya, Tokyo (JP); Takashi Ishigaki, Hino (JP); Nobuyuki Sugii, Tokyo (JP); Shinichiro Kimura, Kunitachi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 288 days.

(21) Appl. No.: 12/481,551

(22) Filed: Jun. 9, 2009

(65) Prior Publication Data

US 2009/0309159 A1    Dec. 17, 2009

(30) Foreign Application Priority Data

Jun. 13, 2008    (JP) .................................. 2008-155443

(51) Int. Cl.
*H01L 29/78* (2006.01)
(52) U.S. Cl. .......... 257/330; 257/E21.619; 257/E21.634
(58) Field of Classification Search .................. 257/330, 257/E21.619, E21.634
See application file for complete search history.

(56) References Cited

U.S. PATENT DOCUMENTS

| 6,171,910 B1 | 1/2001 | Hobbs et al. | |
| 6,246,091 B1 * | 6/2001 | Rodder | 257/335 |
| 2003/0006457 A1 * | 1/2003 | Nishinohara | 257/330 |
| 2004/0248368 A1 * | 12/2004 | Natzle et al. | 438/300 |
| 2006/0157797 A1 | 7/2006 | Tateshita et al. | |

FOREIGN PATENT DOCUMENTS

| JP | 2007-073695 A | 3/2007 |
| JP | 2007-088046 A | 4/2007 |

OTHER PUBLICATIONS

J.Y. Kim et al, "The Breakthrough in data retention time of DRAM using Recess-Channel-Array Transistor (RCAT) for 88nm feature size and beyond", 2003 Symposium on VLSI Technology Digest of Technical Papers, pp. 11-12, 2003.

* cited by examiner

*Primary Examiner* — Jerome Jackson, Jr.
*Assistant Examiner* — Paul Budd
(74) *Attorney, Agent, or Firm* — Miles & Stockbridge P.C.

(57) ABSTRACT

Performance of a semiconductor device having a MIS transistor is improved. A semiconductor device includes: a pair of source/drain regions each formed by stacking a semiconductor layer on a main surface of a silicon substrate; a sidewall insulating film covering each sidewall of the source/drain regions; a gate electrode arranged so as to interpose a gate insulating film on the main surface of the silicon substrate at a position sandwiched by the sidewall insulating films in a plane; and extension regions formed to extend from a portion below and lateral to the gate electrode to a portion below and lateral to each of the source/drain regions, wherein a sidewall of the sidewall insulating film being adjacent to the gate insulating film and the gate electrode has an inclination of a forward tapered shape.

5 Claims, 15 Drawing Sheets

SIGE MOSFET SEMICONDUCTOR DEVICE WITH SLOPED SOURCE/DRAIN REGIONS

CROSS-REFERENCE TO RELATED APPLICATION

The present application claims priority from Japanese Patent Application No. JP 2008-155443 filed on Jun. 13, 2008, the content of which is hereby incorporated by reference into this application.

TECHNICAL FIELD OF THE INVENTION

The present invention relates to a semiconductor device technique. More particularly, the present invention relates to a technique effectively applied to a semiconductor device provided with a MIS transistor having high performance by shortening a gate length.

BACKGROUND OF THE INVENTION

A large scale integrated (LSI) circuit used in a microcomputer for a digital appliance, a personal computer, or the like, or an analog high-frequency electronic part (for example, a transmitting amplifier, an integrated circuit for signal reception, or the like) used in a mobile communication terminal is required to achieve high performance such as high speed, low power consumption, multifunction, or cost reduction. In an electronic element configuring the integrated circuit, for example, a silicon (Si) field-effect transistor (also called FET), high performance of the element (improvement of current driving force and reduction of power consumption) has been realized by fully using photolithography technique to mainly shorten the gate length.

However, in a MIS (Metal Insulator Semiconductor) type field-effect transistor (hereinafter, simply called MIS transistor) having a gate length of 100 nm or shorter, the performance improvement rate is saturated (or reduced). This is mainly caused by increase of gate leakage current due to thinning of a gate insulating film and limitation in reduction of the equivalent oxide thickness (EOT) due to depletion of a polycrystalline silicon (also called polysilicon) gate electrode. In order to solve the issues, there is a technique for achieving the performance improvement of the MIS transistor by replacing a silicon oxide ($SiO_2$) gate insulating film by a high-dielectric (high-K) gate insulating film and replacing the polysilicon gate electrode by a metal gate electrode.

By employing the high-K gate insulating film and the metal gate electrode to a gate, a physical film thickness of the gate insulating film for obtaining the same equivalent oxide film thickness as the silicon oxide film can be made thick. Thereby, the gate leakage current can be reduced and the gate depletion can be suppressed, so that the driving current can be improved. However, heat resistance of materials configuring these high-K gate insulating film and the metal gate electrode is lower than that of silicon oxide and polysilicon. Therefore, phase change occurs in the materials due to process heat affecting the materials during a manufacturing process, which causes degradation of device characteristics such as increase of the gate leakage current and change of flat band voltage. Accordingly, a device formation process applying less heat load on materials of the high-K gate insulating film and the metal gate electrode is required.

For example, U.S. Pat. No. 6,171,910 (Patent Document 1) discloses a damascene gate process technique as a technique of forming a MIS transistor without applying heat load to a high-K gate insulating film and a metal gate electrode.

For example, U.S. Patent Application Publication No. 2006/0157797 (Patent Document 2), Japanese Patent Application Laid-Open Publication No. 2007-073695 (Patent Document 3), and Japanese Patent Application Laid-Open Publication No. 2007-088046 (Patent Document 4) disclose techniques in which source/drain regions are stacked on a substrate, and then, a sidewall film is formed to a dummy gate, and materials of a high-K gate insulating film and a metal gate electrode are buried in a portion obtained by removing the dummy gate. Also, these Patent Documents 2 to 4 also disclose methods of directly forming the gate insulating film on the stacked source/drain regions.

Further, for example, 2003 Symposium on VLSI Technology Digest of Technical Papers, pp. 11 to 12 (Non-Patent Document 1) discloses a technique of employing a recess structure to a channel region of a transistor.

SUMMARY OF THE INVENTION

In the damascene gate process which the present inventors have studied, after heat treatment (anneal) for activating impurities implanted in source/drain regions, a high-K gate insulating film and a metal gate electrode are formed. Accordingly, heat load on the high-K gate insulating film and the metal gate electrode can be reduced. Thereby, phase change of the high-K gate insulating film can be suppressed so that degradation of device characteristics such as increase of gate leakage current and change of flat band voltage can be prevented.

However, it has been found out that the above-described damascene gate process technique involves issues as described below by further studies of the present inventors.

According to a processing technique which the present inventors have studied, a minimum feature size of a gate width is a gate length of about 32 nm even when immersion ArF lithography is used. That is, the size of the dummy gate electrode which can be formed by the damascene gate process becomes 32 nm or longer as converted to the gate length.

Also, according to the studies by the present inventors, in the dummy gate with the gate length of about 32 nm, a height required for application of stress caused by a liner film is about 100 nm. That is, it is necessary to obtain a dummy gate with an aspect ratio of 3 or larger in order to process the dummy gate to an excellent shape and cause the stress of the liner film to act normally. The material configuring the high-K gate insulting film and the metal gate electrode is buried in a trench obtained after removing the dummy gate as described above. That is, according to the damascene gate process technique which the present inventors have studied, the material configuring the high-K gate insulating film and the metal gate electrode must be embedded in a deep trench with the aspect ratio of 3 or larger.

For example, when the MIS transistor having the gate length of 32 nm is formed, physical film thicknesses of the high-K gate insulating film and the metal gate electrode required to obtain excellent characteristics are 2 to 3 nm and about 10 nm, respectively, so that the sum of the physical film thicknesses becomes 13 nm. When the high-K gate insulating film and the metal gate electrode are buried in the trench, first, the trench is buried by depositing these materials over a whole semiconductor substrate. And, according to the studies by the present inventors, it has been found that a cavity (void) is formed at a lower end portion of the gate when such a trench having the aspect ratio of 3 or larger is buried. Occurrence of such a void becomes the cause of degradation of characteristics of the MIS transistor such as ON/OFF characteristic. According to further studies by the present inventors, it has been found that, when the high-K gate insulating film and the metal gate electrode having the above-described film thicknesses are formed by using the damascene gate process as described above, the occurrence of the void at the lower end portion of the gate becomes significant from a gate length of 45 nm or shorter.

Also, it has been found that there are the following issues in a case of a process removing the dummy gate after stacking the source/drain regions and forming the high-K gate insulating film and the metal gate electrode. When the gate insulating film is directly formed on the stacked portion of the source/drain regions, such a structure is provided that the gate electrode and the source/drain regions are partitioned by only a very thin high-K gate insulating film. As a result, a parasitic capacitance equivalent to that of the gate insulating film occurs between the gate electrode and the source/drain regions. The occurrence of such a parasitic capacitance prevents further achievement of high speed of a circuit operation.

As described above, the damascene gate technique which the present inventors have studied is preferable as a method of forming the MIS transistor using the high-K gate insulating film and the metal gate electrode. On the other hand, it is also found by further studies of the present inventors that it is necessary to further improve the above-described damascene gate technique in order to form a MIS transistor with a shorter gate length without causing such a cavity as the void to achieve a semiconductor device with higher performance.

Accordingly, an object of the present invention is to provide a technique for improving performance of a semiconductor device having a MIS transistor.

The above and other objects and novel characteristics of the present invention will be apparent from the description of the present specification and the accompanying drawings.

While a plurality of inventions are disclosed in the present application, a summary of one embodiment thereof will be briefly described as follows.

A semiconductor device includes: a pair of source/drain regions formed on a main surface of a semiconductor substrate in a stacking manner; a sidewall insulating film covering sidewalls of the pair of source/drain regions; a gate electrode arranged at a position sandwiched by the sidewall insulating films on a plane on the main surface of the semiconductor substrate interposing a gate insulating film; and a first semiconductor region formed to extend from a portion below and lateral to the gate electrode to a portion below and lateral to the source/drain region, wherein the sidewall of the source/drain region has an inclination of a forward tapered shape, and the sidewall of the sidewall insulating film being adjacent to the gate insulating film and the gate electrode has an inclination of a forward tapered shape.

The effects obtained by the above-described typical embodiment of a plurality of inventions disclosed in the present application will be briefly described as follows.

That is, performance of a nonvolatile semiconductor storage device can be improved.

BRIEF DESCRIPTIONS OF THE DRAWINGS

DESCRIPTIONS OF THE PREFERRED EMBODIMENTS

Components having the same function are denoted by the same reference symbols throughout the drawings for describing the embodiments, and the repetitive description thereof is omitted as much as possible. Hereinafter, embodiments of the present invention will be described in detail with reference to the accompanying drawings.

First Embodiment

A semiconductor device and a manufacturing method thereof according to a first embodiment will be described in detail with reference to FIGS. 1 to 21.

Figure 1:
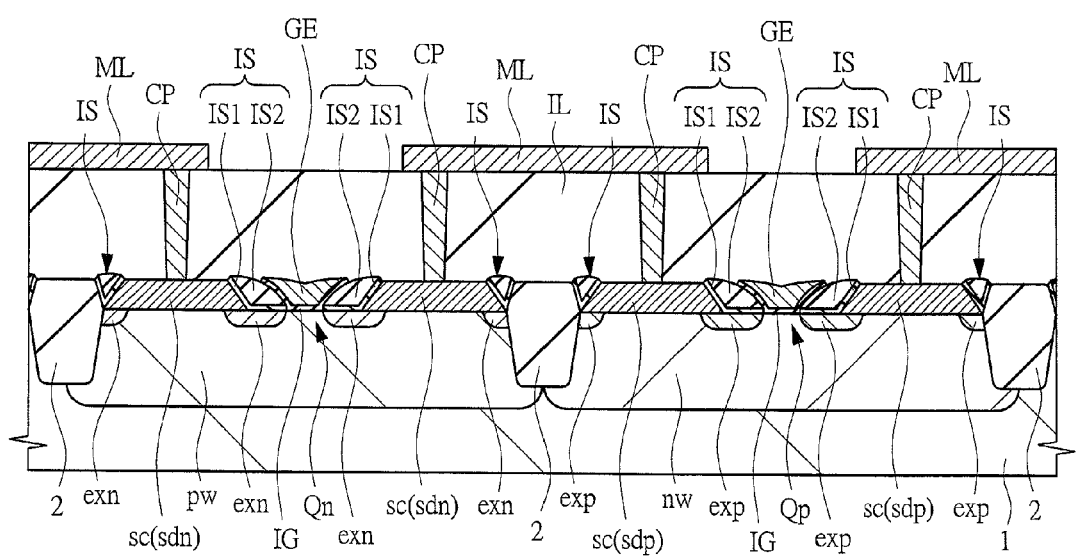
FIG. 1 is a sectional view of a principal part of a semiconductor device according to a first embodiment of the present invention.

First, a configuration of the semiconductor device according to the first embodiment will be described with reference to FIG. 1. FIG. 1 shows a sectional view of a principal part of the semiconductor device according to the first embodiment. The semiconductor device according to the first embodiment includes an n-channel type MIS transistor Qn (hereinafter, simply called n-type MIS transistor Qn) and a p-channel type MIS transistor Qp (hereinafter, simply called p-type MIS transistor Qp) formed on a silicon substrate (semiconductor substrate) 1. Here, the term "n-type" indicates a conductive type or conductive state of a semiconductor region where of the majority carrier is electron, and the term "p-type" indicates a conductive type or conductive state of a semiconductor region where of the majority carrier is positive hole (also called "hole"). Note that the conductive type of the silicon substrate 1 can be p-type or n-type.

The n-type MIS transistor Qn is arranged in a p-well pw which is a p-type semiconductor region formed on the main surface of the silicon substrate 1. The p-type MIS transistor Qp is arranged in an n-well nw which is an n-type semiconductor region formed on the main surface of the silicon substrate 1. These transistors are arranged in active regions separated by an isolating portion 2 formed on the main surface of the silicon substrate 1. The isolating portion 2 has a so-called STI (Shallow Trench Isolation) structure in which an insulating film mainly made of silicon oxide is buried in a shallow trench. Although a case is shown in FIG. 1 that the n-type MIS transistor Qn and the p-type MIS transistor Qp are respectively formed in the p-well pw and the n-well nw arranged adjacent to each other interposing the isolating portion 2, the arrangement is not limited to the case.

Hereinafter, a configuration of the n-type MIS transistor Qn which the semiconductor device according to the first embodiment includes will be described in detail. The n-type MIS transistor Qn according to the first embodiment has the following configuration.

The n-type MIS transistor Qn according to the first embodiment includes a pair of n-type source/drain regions (source/drain region) "sdn" formed of an n-type semiconductor layer which is formed so as to stack on the main surface of the p-well pw of the silicon substrate 1. The pair of n-type source/drain regions sdn is arranged at a predetermined distance to each other on the main surface of the silicon substrate 1.

Here, a sidewall of the n-type source/drain region sdn according to the first embodiment has the following shape. The sidewall of the n-type source/drain region sdn has inclination of the so-called forward tapered shape. That is, the sidewall has such a shape that a height thereof from the main surface of the silicon substrate 1 becomes lower toward its end portion.

Also, the n-type MIS transistor Qn according to the first embodiment includes a spacer-shaped sidewall insulating film IS arranged adjacent to the sidewall of the n-type source/drain region sdn.

Here, in the sidewall insulating film IS according to the first embodiment, a sidewall thereof which is not adjacent to the n-type source/drain region sdn has the following shape. That is, the sidewall of the sidewall insulating film IS which is not adjacent to the n-type source/drain region sdn is formed in the so-called forward tapered shape such that its height from the main surface of the silicon substrate 1 becomes lower toward its end portion. Here, the sidewall of the sidewall insulating film IS which is not adjacent to the n-type source/drain region sdn described above indicates a sidewall adjacent to a gate insulating film IG and a gate electrode GE described later. Also, in FIG. 1, a surface of the sidewall of the sidewall insulating film IS is a curved surface, and a cross-sectional surface thereof has an upwardly convex arc shape. However, the surface of the sidewall may be a flat surface.

As described above, an effect obtained by providing the inclination of the forward tapered shape in the n-type source/drain region sdn and the sidewall insulating film IS will be described in detail later.

Note that the sidewall insulating film IS may have a stacked structure of a first sidewall insulating film IS1 and a second sidewall insulating film IS2. In this case, the first sidewall insulating film IS1 is formed so as to relatively thinly cover a portion from the sidewall of the n-type source/drain region sdn to the main surface of the silicon substrate 1 located on a lateral lower portion of the sidewall. The second sidewall insulating film IS2 is formed so as to relatively thickly cover the relatively thin first sidewall insulating film. That is, the sidewall insulating film IS includes the first sidewall insulating film IS1 and the second sidewall insulating film IS2 formed in this order from a portion close to the n-type source/drain region sdn. For example, the first sidewall insulating film IS1 is formed of an insulating film mainly made of silicon oxide, and the second sidewall insulating film IS2 is formed of an insulating film mainly made of silicon nitride.

Also, the n-type MIS transistor Qn according to the first embodiment includes the gate electrode GE arranged on the main surface of the silicon substrate 1 interposing the gate insulating film IG. The gate electrode GE is arranged at a position between the pair of n-type source/drain regions sdn and sandwiched by the sidewall insulating films IS in the plane on the main surface of the silicon substrate 1. The gate insulating film IG is formed to link a portion extending from a boundary between the sidewall insulating film IS and the gate electrode GE to a boundary between the silicon substrate 1 and the gate electrode GE so as to separate each of them.

Here, the above description has been made such that, in the sidewalls of the sidewall insulating film IS, the sidewall which is not adjacent to the n-type source/drain region sdn has the forward tapered shape. In other words, this has the same meaning such that, in the sidewalls of the sidewall insulating film IS, a sidewall which is adjacent to the gate insulating film IG and the gate electrode GE has the forward tapered shape.

Also, the n-type MIS transistor Qn according to the first embodiment includes an n-type extension region (first semiconductor region) "exn" which is an n-type semiconductor region formed on the main surface of the silicon substrate 1. The n-type extension region exn is formed on a region of the main surface of the silicon substrate 1 extending from a position of a lateral lower position of the gate electrode GE up to a position overlapping with an end portion of the n-type source/drain region sdn in the plane. The n-type extension region exn and the n-type source/drain region sdn are the same n-type conductive type, and they are electrically connected to each other at the position where they are overlapped to each other in the plane.

Such an n-type extension region exn is formed in order to smoothly transfer carrier between a channel region which is a surface of the silicon substrate 1 located under the gate electrode GE and the n-type source/drain region sdn. Accordingly, an n-type impurity concentration in the n-type extension region exn is determined according to characteristics required for the n-type MIS transistor Qn. Normally, the n-type impurity concentration in the n-type extension region exn is lower than an n-type impurity concentration in the n-type source/drain region sdn.

The n-type MIS transistor Qn having the above-described configuration is covered with an interlayer insulating film IL on the silicon substrate 1, and it is electrically connected to a wiring layer ML formed on the interlayer insulating film IL through a contact plug CP formed in the interlayer insulating film IL. More specifically, such a structure is provided that the conductive contact plug CP is electrically connected to the n-type source/drain region sdn and the gate electrode GE of the n-type MIS transistor Qn, so that there is provided a structure which can be externally electrically conducted through the wiring layer ML. The wiring structure configured with the interlayer insulating film IL, the contact plug CP, and the wiring layer ML may be similarly formed also on its further upper layer to make a multilayer wiring structure.

The above description has been made for a basic configuration of the n-type MIS transistor Qn and the wiring structure of the semiconductor device according to the first embodiment. Hereinafter, an effect obtained by such a fact that the n-type MIS transistor Qn has the above-described configuration will be described in detail.

In the n-type MIS transistor Qn of the semiconductor device according to the first embodiment, the following effect can be obtained by adopting the gate structure as described above. That is, an n-type MIS transistor Qn having a gate electrode GE having a gate length shorter than the minimum feature size can be obtained by having the gate electrode GE arranged inside the forward tapered shape sidewall insulating film IS. The gate length indicates a size of a region of a bottom portion of a gate electrode GE facing the silicon substrate 1, and more particularly, it indicates a length viewed along a moving direction of carrier. In other words, the gate length is substantially equal to a distance between the n-type extension regions exn arranged at lateral lower portions of the gate electrode GE. More specifically, the n-type MIS transistor Qn according to the first embodiment has a gate electrode GE having a gate length of 32 nm or shorter.

Further, even if the gate electrode GE according to the first embodiment has the short gate length as described above, it does not have a cavity such as a void. As described above, according to the first embodiment, a gate length of a MIS transistor can be further shortened without degrading characteristics of the MIS transistor such as ON/OFF characteristic. As a result, performance of a semiconductor device having a MIS transistor can be improved.

In effects which are obtainable by the n-type MIS transistor Qn according to the first embodiment as described above, an effect obtained by a feature of a manufacturing method of the semiconductor device will be described in detail together with a description of the manufacturing method described later.

Also, it is preferable that the n-type MIS transistor Qn of the semiconductor device according to the first embodiment has the following configuration in addition to the basic configuration described above.

Although the insulating material for forming the gate insulating film IG may be an insulating film mainly made of silicon oxide, it is more preferable that the insulating material is a so-called high-K insulating film having a dielectric constant higher than that of silicon oxide. As the gate insulating film IG having the dielectric constant higher than that of silicon oxide, there is an insulating film mainly made of, for example, silicon oxynitride ($SiO_xN_y$), silicon nitride ($Si_xN_y$), tantalum oxide ($Ta_2O_5$), titanium oxide ($TiO_2$), aluminum oxide ($Al_2O_3$), hafnium oxide ($HfO_2$), or hafnium-silicon-oxynitride (HfSiON). By forming the gate insulating film IG by using such a high-K material, the equivalent oxide thickness can be decreased. That is, even if the physical film thickness of the gate insulating film IG is made large, the same field effect can be obtained compared to the case of using the silicon oxide film. Thereby, in the n-type MIS transistor Qn according to the first embodiment having the effect as described above, leakage current can be reduced. As a result, performance of the semiconductor device having the MIS transistor can be further improved.

Also, although the conductive material for forming the gate electrode GE may be a conductive film mainly made of polysilicon containing impurities, it is more preferable that the conductive material is so-called metal gate electrode material using a conductive film mainly made of titanium nitride (TiN), molybdenum nitride (MoN), hafnium silicide (HfSi), or the like. This is because, by forming the gate electrode GE by using such a metal gate electrode material, there can be provided a gate electrode GE which is hardly depleted than the case of using the polysilicon film. Thereby, in the n-type MIS transistor Qn according to the first embodiment having the effect as described above, driving current can be further improved. As a result, performance of the semiconductor device having the MIS transistor can be further improved.

Further, although the n-type source/drain region sdn may be a semiconductor layer mainly made of silicon containing impurities of n-type, it is more preferable that the n-type source/drain region sdn is a semiconductor layer mainly made of a mixed crystal of silicon and germanium (Ge). This is because stress can be applied to a channel region made of the single crystal of silicon by forming the n-type source/drain region sdn formed by newly stacking on the silicon substrate 1 from the mixed crystal of silicon and germanium, as described in detail later. Such a stress applied to the channel region has an effect of improving channel mobility (carrier mobility in the channel region). Thereby, in the n-type MIS transistor Qn according to the first embodiment having the effect as described above, the driving current can be further improved. As a result, performance of the semiconductor device having the MIS transistor can be further improved.

Still further, although the n-type source/drain region sdn may be a semiconductor layer made of silicon or the mixed crystal of silicon and germanium as described above, it is more preferable that a partial or whole surface of the n-type source/drain region sdn is formed of a metal silicide layer "sc". This is because ohmic connection of the n-type source/drain region sdn with the contact plug CP can be obtained by providing the metal silicide layer sc having a resistance value lower than that of the semiconductor layer on the surface of the n-type source/drain region sdn. Thereby, in the n-type MIS transistor Qn according to the first embodiment having the effect as described above, the driving current can be further improved. As a result, performance of the semiconductor device having the MIS transistor can be further improved.

Here, when a part of the n-type source/drain region sdn has a structure formed by the metal silicide layer sc, a region other than the metal silicide layer sc is formed of an n-type semiconductor layer in the n-type source/drain region sdn. As the above-described metal silicide layer sc formed as the n-type source/drain region, there is a metal silicide layer sc mainly made of, for example, cobalt silicide, nickel silicide, platinum silicide, tungsten silicide, or molybdenum silicide. Note that FIG. 1 shows a case that the whole n-type source/drain region sdn is formed by the metal silicide layer sc.

Also, although the sidewall insulating film IS covering the sidewall of the n-type source/drain region sdn may be formed of an insulating layer of a single layer, it may be formed of a two-layered stacked structure having the first sidewall insulating film IS1 and the second sidewall insulating film IS2 in this order from a lower layer as described above. In this case, more particularly, it is more preferable that the dielectric constant of the first sidewall insulating film IS1 is equal to or lower than that of the second sidewall insulating film IS2. This is because the driving current of the n-type MIS transistor Qn can be further improved by adopting such a structure. As a result, performance of the semiconductor device having the MIS transistor can be further improved. In the above description, as one example of such a combination of the first sidewall insulating film IS1 and the second sidewall insulating film IS2, such a structure is shown that the silicon oxide film and the silicon nitride film are used for the side insulating films IS1 and IS2, respectively. On the other hand, in the semiconductor device according to the first embodiment, materials to be used for the side insulating films are not limited to these materials, and a combination of insulating films mainly made of silicon oxynitride, tantalum oxide, titanium oxide, aluminum oxide, or the like, which satisfies the above condition may be used as the sidewall insulating film IS.

In the foregoing, the configuration of the n-type MIS transistor Qn of the semiconductor device according to the first embodiment has been described in detail. Meanwhile, as described above, the semiconductor device according to the first embodiment may include a p-type MIS transistor Qp formed on an n-well "nw" on the same silicon substrate 1.

The p-type MIS transistor Qp has a polarity opposite to the semiconductor layer (or semiconductor region) for configuring the n-type MIS transistor, and it has a configuration similar to the n-type MIS transistor Qn other than the polarity. More specifically, the p-type MIS transistor Qp includes the gate insulating film IG, the gate electrode GE, and the sidewall insulating film IS each having the similar configuration to those of the n-type MIS transistor Qn. Also, the p-type MIS transistor Qp includes p-type source/drain regions (source/drain region) "sdp" and a p-type extension region (first semiconductor region) "exp" whose respective polarities are reversed to those of the n-type source/drain regions sdn and the n-type extension regions exn of the n-type MIS transistor Qn, and whose shapes are similar to those of the n-type MIS transistor Qn. And, in the p-type MIS transistor Qp, external electrical conduction is possible by a wiring structure (the interlayer insulating film IL, the contact plug CP, and the wiring layer ML) similar to that of the n-type MIS transistor Qn.

Regarding the effects obtained by the configuration as described above in the n-type MIS transistor Qn, similar effects can be obtained in the configuration of the p-type MIS transistor Qp similar to that of the n-type MIS transistor Qn.

Note that, as shown in FIG. 1, in the semiconductor device according to the first embodiment, there are provided the sidewall insulating film IS even on sidewalls of the pair of n-type source/drain regions sdn which are not faced to each other, and the n-type extension region exn is formed even on portions of the silicon substrate 1 located on lateral lower portions of the sidewalls of the pair of n-type source/drain regions which are not faced to each other. The sidewall insulating film IS and the n-type extension region exn are not essential components in the semiconductor device according to the first embodiment, and they are formed in the course of the manufacturing processes in the configuration. The same holds true for the sidewall insulating film IS and the p-type extension region exp in the p-type MIS transistor Qp.

Next, a manufacturing method of the semiconductor device according to the first embodiment will be described in detail with reference to FIGS. 2 to 19. Note that, in a configuration formed by the following steps, configurations similar to that described above have similar effects, and overlapped descriptions are omitted here.

Figure 2:
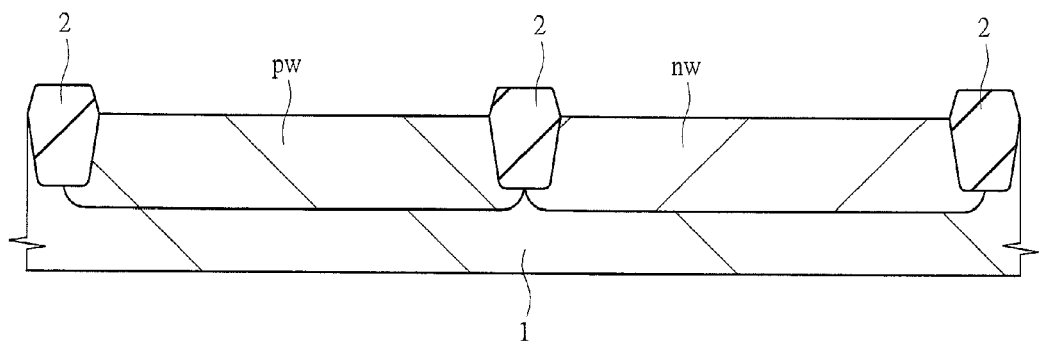
FIG. 2 is a sectional view of the principal part of the semiconductor device according to the first embodiment of the present invention in a manufacturing process thereof.

First, as shown in FIG. 2, the p-well pw, the n-well nw, and the isolating portion 2 with the STI structure are formed on the main surface of the silicon substrate 1.

The p-well pw and the n-well nw are formed by implanting impurities to the silicon substrate 1 by ion implantation method and heating by heat treatment to activate and diffuse them. When impurities to be different conductive types are implanted in different regions, a photoresist film (not shown) patterned by photolithography method and the like is formed to selectively implant impurity ions by using the photoresist film as an ion implantation mask. Also, the heat treatment for activating and diffusing impurities may be performed simultaneously with heat treatments required in other steps. Thereby, the number of steps can be reduced. Hereinafter, the method of forming semiconductor regions having various conductive types will be similarly performed.

The isolating portion 2 with the STI structure is formed by forming a shallow trench in a predetermined region of the silicon substrate 1 by anisotropic etching method and filling silicon oxide inside the trench. The isolating portions 2 are formed for separating active regions for forming various elements on the main surface of the silicon substrate 1.

Figure 3:
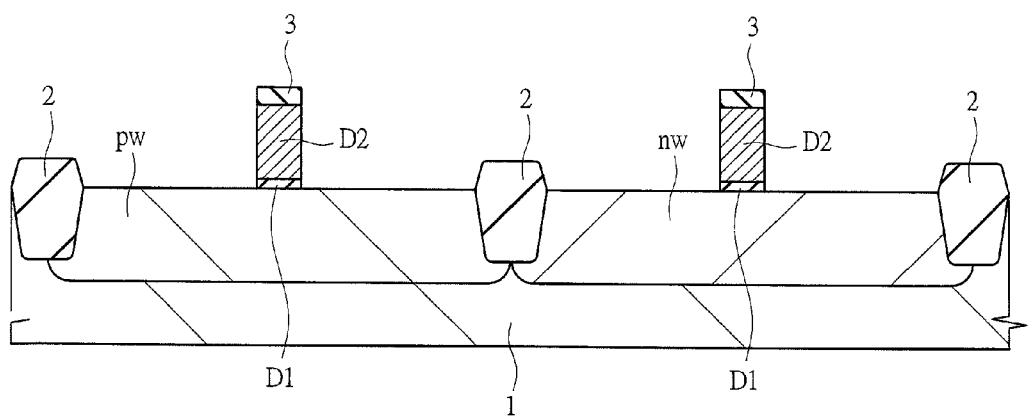
FIG. 3 is a sectional view of the principal part of the semiconductor device in the manufacturing process thereof continued from FIG. 2.

Next, as shown in FIG. 3, dummy gate electrodes D2 are formed on main surfaces of both the regions of the p-well pw and the n-well nw via dummy gate insulating films D1. The dummy gate insulating films D1 and dummy electrodes D2 are formed in the following manner.

First, a film-like silicon oxide film to be the dummy gate insulating film D1 later is formed by oxidizing the main surface of the silicon substrate 1 by thermal oxidation method. Thereafter, a film-like polysilicon film (or may be a silicon germanium film, a metal silicide film, a metal film, or the like) to be the dummy gate electrode D2 later is formed by chemical vapor deposition (CVD) method and the like so as to cover the silicon oxide film. Thereafter, a cap film 3 formed of an insulating film mainly made of silicon nitride is formed by CVD method and the like so as to cover the polysilicon film.

Subsequently, the cap film 3 is processed by photolithography method and anisotropy etching method. And, anisotropic etching is sequentially performed to each of the polysilicon film and the silicon oxide film on a lower layer of the cap film 3 by using the cap film 3 as an etching mask, so that the dummy date electrodes D2 and the dummy gate insulating films D1 are formed.

Figure 4:
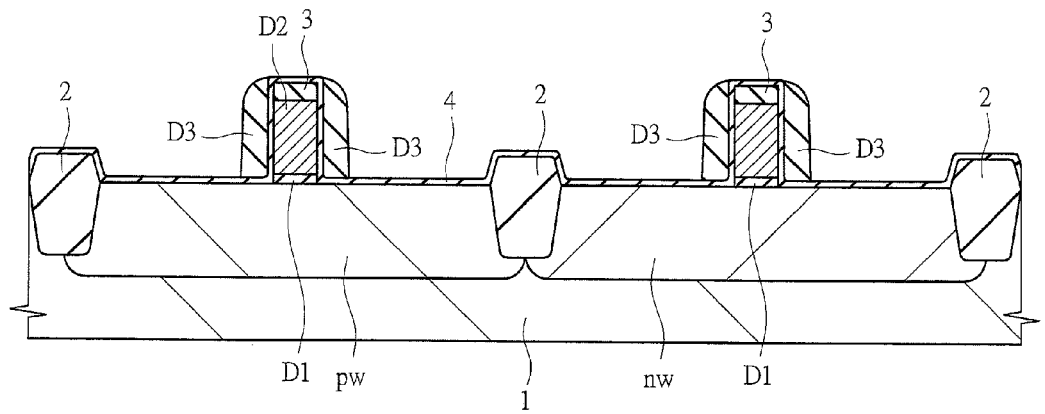
FIG. 4 is a sectional view of the principal part of the semiconductor device in the manufacturing process thereof continued from FIG. 3.

Next, as shown in FIG. 4, an etching stopper film 4 having a thickness of about 1 to 10 nm is formed so as to thinly cover surfaces of the main surface of the silicon substrate 1, the dummy gate electrodes D2, and the cap films 3. There is provided the above-described etching stopper film 4 by forming a silicon oxide film by, for example, low-pressure CVD method and the like.

Subsequently, a first dummy sidewall insulating films D3 is formed so that the sidewall of the dummy gate electrode D2 and the portion of the silicon substrate 1 located on the lateral lower portion of the dummy gate electrode D2 are thinly covered interposing the etching stopper films 4. First, an insulating film having a thickness of about 20 to 40 nm and mainly made of silicon nitride is formed by CVD method and the like so as to cover the etching stopper film 4. Thereafter, anisotropic etching such as reactive ion etching (RIE) method is performed to the silicon nitride film. Here, the anisotropic etching is wholly performed to the silicon nitride film without forming the etching mask and the like.

Here, the silicon nitride film is thickly formed at a step portion of the dummy gate electrode D2 compared to a flat portion of the dummy gate electrode D2. Therefore, when the anisotropic etching is wholly performed, the silicon nitride film can remain so as to cover the sidewall of the dummy gate electrode D2 even if the silicon nitride film on the flat portion is removed. Accordingly, there is formed the first dummy sidewall insulating film D3 formed of the silicon nitride film covering the sidewall of the dummy gate electrode D2. In this manner, such a method is described as etch back that the anisotropic etching is wholly performed to a desired film for remaining the desired film in a sidewall shape on the sidewall of the step portion.

Note that, in the step, the etching stopper film 4 is provided so as not to damage the main surface of the silicon substrate 1 on the lower layer and the like due to the anisotropic etching when etch back is performed to the silicon nitride film. Therefore, as a material of the etching stopper film 4, it is desirable to use a material having a larger selectivity for the first dummy sidewall insulating film D3 in a predetermined anisotropic etching, and the material is not limited to the above-mentioned silicon oxide film. In the manufacturing method according to the first embodiment, such a method is described that the silicon oxide film is used for the etching stopper film 4 and the silicon nitride film is used for the first dummy sidewall insulating film D3 as the combination of materials as described above.

Figure 5:
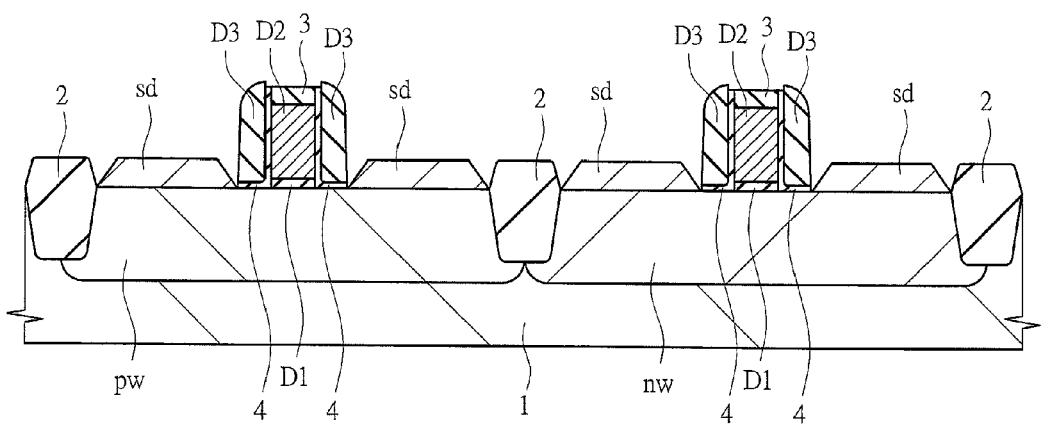
FIG. 5 is a sectional view of the principal part of the semiconductor device in the manufacturing process thereof continued from FIG. 4.

Next, as shown in FIG. 5, portions of the etching stopper film 4 which are not covered by the first dummy sidewall insulating films D3 are removed. Exposed portions of the etching stopper film 4 formed of the silicon oxide film are removed by, for example, isotropic wet etching by soaking in hydrofluoric acid (hydrogen fluoride: HF) solution. In the step, an etching process which gives less damage to the main surface of the silicon substrate 1 being a base body and the like is performed by using the isotropic etching, so that the etching stopper film 4 can be removed.

At a time of finishing the above-described step, the main surface of the silicon substrate 1 is exposed in regions where none of the dummy gate electrode D2, the first dummy sidewall insulating film D3, and the isolating portion 2 are formed. And, in the manufacturing method according to the first embodiment, source/drain regions "sd" formed of a semiconductor layer having a thickness of about 30 to 50 nm are formed on portions in which the main surface of the silicon substrate 1 is exposed. That is, in the step, the source/drain regions sd are formed by stacking the semiconductor layer in regions which are not covered by the dummy gate electrode D2 and the first dummy sidewall insulating film on the main surface of the silicon substrate 1.

To form the source/drain region sd, silicon is deposited by low-pressure CVD method using, for example, dichlorosilane ($SiH_2Cl_2$) gas and hydrogen chloride (HCl) gas. According to this method, the silicon layer deposited on exposed portions of the silicon substrate 1 epitaxially grows to follow a single crystal substrate. The pair of source/drain regions formed of the semiconductor layer arranged separated from each other by a predetermined distance is formed on the main surface of the silicon substrate 1 by such a selective epitaxial growth method. Note that, the silicon layer crystal-grown as the source/drain region sd in the step is prevented from containing predetermined impurities.

Further, in the step, an inclination (facet) depending on a predetermined crystal plane can be formed on a sidewall of the source/drain region sd formed on the silicon substrate 1 in a depositing manner by controlling crystal growth condition of the selective epitaxial growth. For example, when a selectivity of the crystal growth condition is raised (raising a processing temperature, increasing a flow rate of hydrogen chloride gas, or the like), the facet is easy to be formed. Facet planes formed at this time are (111) plane, (113) plane, and the like, and their respective inclination angles are 25° and 55° for the main surface (defined as (100) plane) of the silicon substrate 1 to be in a range forming a forward tapered shape, and therefore, the facets are not vertically formed. Accordingly, in the step, the source/drain region sd is formed so as to have the inclination of the forward tapered shape on its sidewall as described in FIG. 1. In the manufacturing method according to the first embodiment, effects in the manufacturing method obtained by forming the source/drain region sd so as to have the inclination as described above will be described in detail later.

Also, in the above-described step, such a method has been described that the source/drain region sd is formed by stacking the silicon layers according to epitaxial growth. On the other hand, in the manufacturing method according to the first embodiment, it is more preferable that the source/drain region sd is formed by stacking a semiconductor layer mainly made of the mixed crystal of silicon and germanium. The reason is that the effects described with reference to FIG. 1 can be obtained by using the mixed crystal of silicon and germanium as the source/drain region sd.

The mixed crystal layer of silicon and germanium is formed by using selective epitaxial growth method. More specifically, the mixed crystal layer of silicon and germanium can be epitaxially grown by low-pressure CVD method using, for example, dichlorosilane gas, monogermane ($GeH_4$) gas, and hydrogen chloride gas. The orientation of the facet plane can be changed within the range of obtaining the forward tapered shape also in the source/drain region sd formed of the mixed crystal layer of silicon and germanium similar to that of the source/drain region sd formed of the above-described silicon layer.

Figure 6:
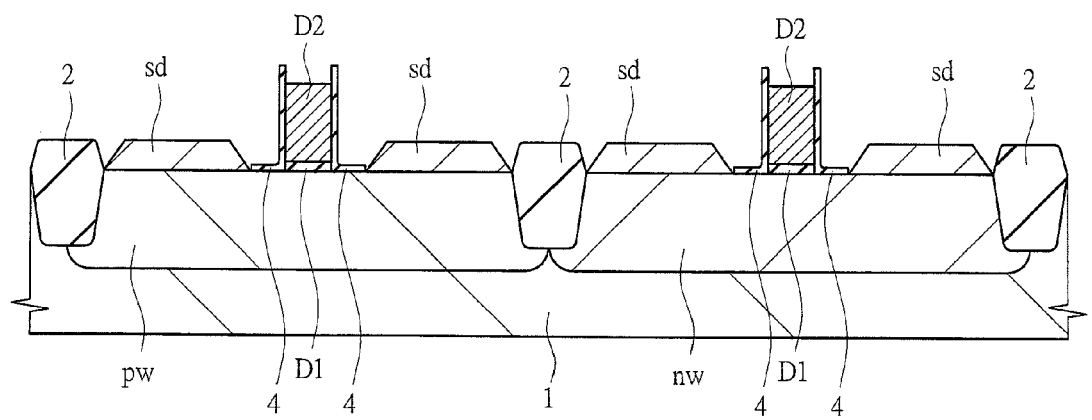
FIG. 6 is a sectional view of the principal part of the semiconductor device in the manufacturing process thereof continued from FIG. 5.

Next, as shown in FIG. 6, the first dummy sidewall insulating films D3 are removed. At this step, the first dummy sidewall insulating films D3 formed of the silicon nitride film are removed by isotropic wet etching by soaking in, for example, hot phosphoric acid ($H_3PO_4$). At this time, the cap films 3 formed of the silicon nitride film are similarly removed. In the step, the etching process which gives less damage to the surface of the source/drain region sd being a base body is performed by using the isotropic etching, so that the first dummy sidewall insulating films D3 can be removed.

Figure 7:
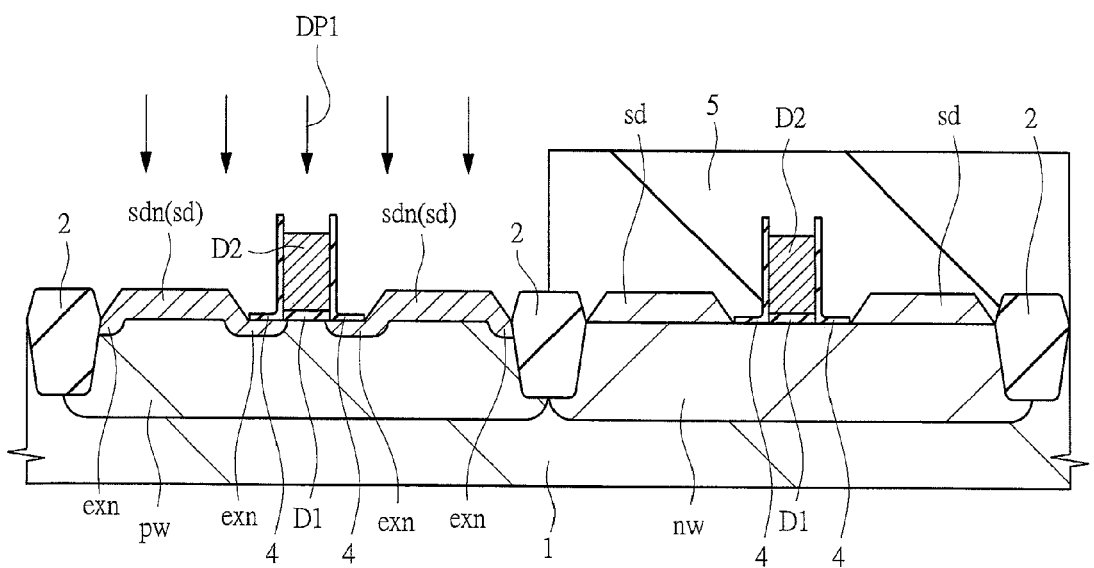
FIG. 7 is a sectional view of the principal part of the semiconductor device in the manufacturing process thereof continued from FIG. 6.

Next, as shown in FIG. 7, a photoresist film 5 is formed so as to cover a region of the n-well nw in which the p-type MIS transistor Qp is formed later (see FIG. 1 described above) on the main surface of the silicon substrate 1 by photolithography method and the like. Thereafter, with using the photoresist film 5 as an ion-implantation mask, ion implantation DP1 is performed to the region of the p-well pw in which the n-type MIS transistor Qn is formed later (see FIG. 1 described above) on the main surface of the silicon substrate 1. In the ion implantation DP1, for example, arsenic (As), phosphorus (P), or the like is implanted as the n-type impurity with an accelerating voltage of 5 keV and a dose amount of about $1\times10^{15}$ cm$^{-2}$.

At this time, the dummy gate electrode D2 and the source/drain region sd formed to have predetermined thicknesses on the main surface of the p-well pw to which the ion implantation DP1 is performed serve as ion-implantation masks for the ion implantation DP1. Therefore, the region where the impurity ion is introduced by the ion implantation DP1 is a region extending from a position of a lateral lower portion of the dummy gate electrode D2 to a position overlapping with an end portion of the source/drain region sd in the plane.

Here, the source/drain region sd has the inclination of the forward tapered shape as described above, and it becomes thinner toward its end portion. Thereby, impurities implanted by the ion implantation DP1 transmits the end portion of the source/drain region sd to reach the main surface of the silicon substrate 1. Accordingly, ion implantation DP1 is also performed to the position overlapping with the end portion of the source/drain region sd in the plane. After performing the ion implantation DP1, the photoresist film 5 is removed.

Thereafter, heat treatment at 1000° C. for about 1 second is performed by, for example, RTA (Rapid Thermal Annealing) method and the like. The implanted impurities are activated and diffused by the heat treatment. By the foregoing steps, the n-type extension region exn is formed on regions, to which impurity ions are implanted by the ion-implantation DP1, from the position of the lateral lower portion of the dummy gate electrode D2 to the position overlapping with the end portion of the source/drain region sd in the plane.

Note that, in the pair of source/drain regions sd, the inclination of the forward tapered shape is formed on sidewalls not only in their end portions facing to each other but also in the other end portions. Therefore, the n-type extension regions exn are formed at lower portions of both ends of the source/drain region sd. In these configurations, essential ones for the device configuration are the n-type extension regions exn formed on the sides of end portions where the pair of source/drain regions sd are faced to each other. That is, the n-type extension region exn formed on the region from the position of the lateral lower portion of the dummy gate electrode D2 to the position overlapping with the end portion of the source/drain region sd on a plane becomes a component configuring the device.

Also, the source/drain region sd described to serve as the ion-implantation mask in the above description is the semiconductor layer obtained by crystal growth of silicon, and it is similarly changed to n-type conductivity by the ion implantation DP1 and the heat treatment thereafter. Hereinafter, the source/drain region sd which is changed to the n-type conductivity by the ion implantation DP1 will be called as an n-type source/drain region sdn. As described above, the n-type source/drain region sdn and the n-type extension region exn overlap with each other in the plane and are electrically connected to each other at their end portions.

Figure 8:
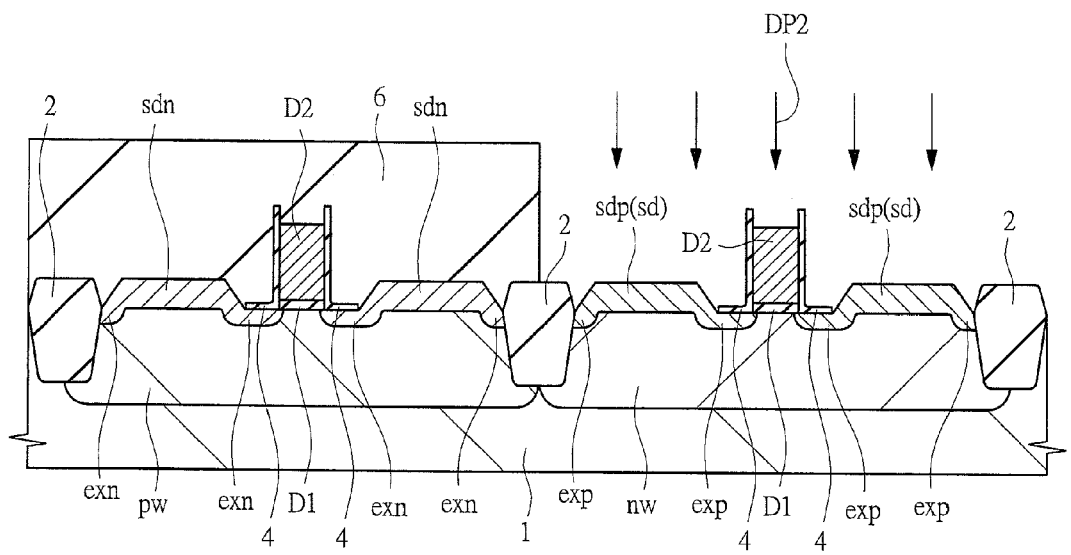
FIG. 8 is a sectional view of the principal part of the semiconductor device in the manufacturing process thereof continued from FIG. 7.

Next, as shown in FIG. 8, a photoresist film 6 is formed by photolithography method and the like so as to cover the region of the p-well pw in which the n-type MIS transistor Qn is formed later (see FIG. 1 described above) on the main surface of the silicon substrate 1. Thereafter, with using the photoresist mask 6 as an ion-implantation mask, ion implantation DP2 is performed on the region of the n-well nw in which the p-type MIS transistor Qp is formed later (see FIG. 1 described above) on the main surface of the silicon substrate 1. In the ion implantation DP2, for example, boron (B) or the like as a p-type impurity is implanted with the same accelerating voltage and the same dose amount as those of the ion-implantation DP1 of FIG. 7 described above. Thereafter, the photoresist film 6 is removed.

Such ion implantation DP2 is similar to the ion implantation DP1 of FIG. 7 described above except for differences in the polarity and the implanted portion. That is, there are provided the p-type extension region exp and the p-type source/drain region sdp whose polarities are opposite to those of the n-type extension region exn and the n-type source/drain region sdn of FIG. 7 described above, and whose shapes are to the same with those of the n-type extension region exn and the n-type source/drain region sdn, within the n-well nw and on the n-well nw by the ion implantation DP2 of the step. Thereafter, the implanted impurities are activated and diffused by the heat treatment similar to that of FIG. 7 described above.

Also, in the above description, the steps has been described above such that the n-type source/drain regions sdn and the n-type extension regions exn are formed prior to the p-type source/drain regions sdp and the p-type extension regions exp. However, the order of forming them may be reversed. Further, the heat treatment for activating and diffusing implanted impurities may be performed at the same step.

Figure 9:
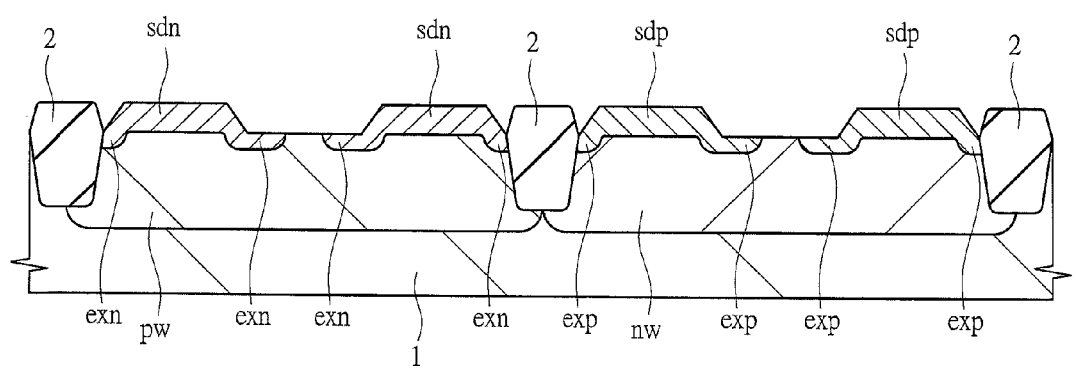
FIG. 9 is a sectional view of the principal part of the semiconductor device in the manufacturing process thereof continued from FIG. 8.

Next, as shown in FIG. 9, for example, the etching stopper film 4, the dummy gate electrode D2, and the dummy gate insulating film D1 of FIG. 8 described above are removed. The removal is performed by, for example, wet etching of a silicon oxide film by using hydrofluoric acid, wet etching of a polycrystal silicon film by rinsing in ammonia-hydrogen peroxide mixture solution (also called "APM"), or the like.

Figure 10:
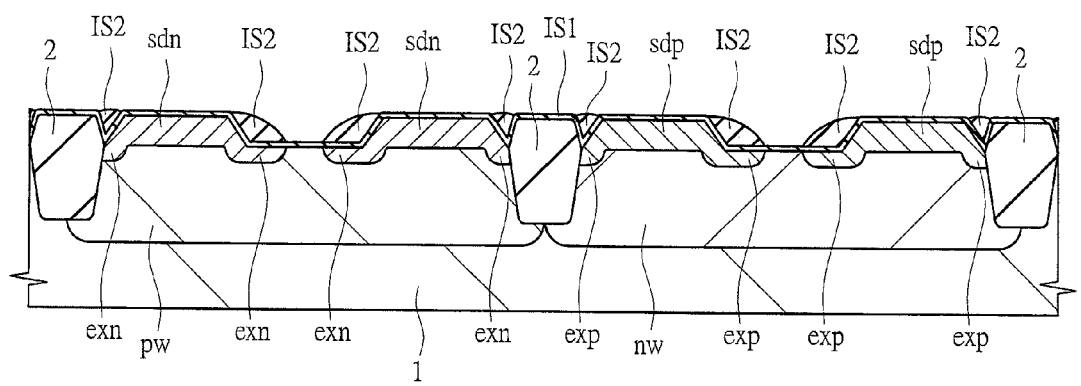
FIG. 10 is a sectional view of the principal part of the semiconductor device in the manufacturing process thereof continued from FIG. 9.

Next, as shown in FIG. 10, the first sidewall insulating film IS1 having a film thickness of about 1 to 10 nm and mainly made of silicon oxide is formed on the whole surface of the silicon substrate 1 by using low-pressure CVD method. Thereafter, a second sidewall insulating film IS2 having a film thickness of about 20 to 40 nm and mainly made of silicon nitride is formed on the first sidewall insulating film IS1 using low-pressure CVD method.

Thereafter, etch back is performed to the second sidewall insulating film IS2. At this time, since the second sidewall insulating films IS2 formed on the step portions are apparently thick, they can remain even if all the second sidewall insulating film IS2 formed on the flat portions are removed. That is, there can be formed the second sidewall insulating films IS2 having such a shape as to cover the sidewalls of the n-type source/drain region sdn and p-type source/drain region sdp forming the step portions on the silicon substrate 1. Note that, according to the step, the second sidewall insulating films IS2 are also formed not only on the sidewalls of the pair of n-type source/drain regions sdn (p-type source/drain region sdp) facing to each other but also on the sidewalls of the pair of n-type source/drain regions sdn facing to the isolating portion 2.

Figure 11:
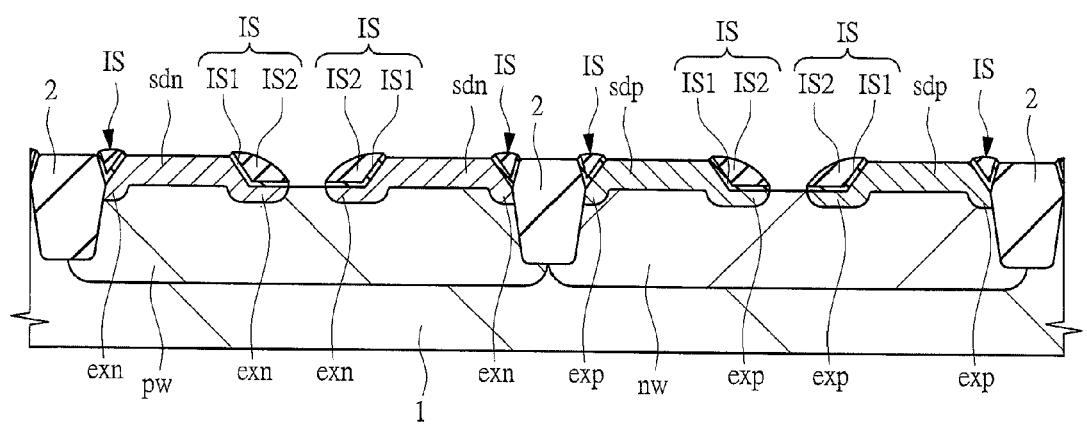
FIG. 11 is a sectional view of the principal part of the semiconductor device in the manufacturing process thereof continued from FIG. 10.

Next, as shown in FIG. 11, exposed portions of the first sidewall insulating film IS1 which are not covered by the second sidewall insulating film IS2 are removed by performing the wet etching by using hydrofluoric acid. Here, in the manufacturing method according to the first embodiment, although the sidewall insulating film IS may be formed of a single-layered insulating film, there may be formed a two-layered stacked structure by sequentially forming the first sidewall insulating film IS1 and the second sidewall insulating film IS2 in this order from the lower layer as described above. In this case, more particularly, it is more preferable that a dielectric constant of the first sidewall insulating film IS1 is equal to or lower than that of the second sidewall insulating film IS2. The reason and effect are as described with reference to FIG. 1. In the above description, as one example of such a combination of the first sidewall insulating film IS1 and the second sidewall insulating film IS2, a structure in which the silicon oxide film and the silicon nitride film are adopted to the first and second sidewall insulating films, respectively has been described. Meanwhile, in the manufacturing method according to the first embodiment, these materials to be used are not limited to them, and the sidewall insulating film IS may be formed by a combination of materials of the insulating films mainly made of, for example, silicon oxynitride, tantalum oxide, titanium oxide, aluminum oxide, or the like which satisfies the above-described condition.

As described above, in the manufacturing method according to the first embodiment, the sidewall insulating films IS formed of the first sidewall insulating film IS1 and the second sidewall insulating film IS2 are formed so as to be adjacent to sidewalls of the pair of n-type source/drain regions sdn (p-type source/drain regions sdp).

Here, according to the manufacturing method of the first embodiment, each sidewall of the sidewall insulating films IS is formed so as to have the inclination of the forward tapered shape, the sidewall being not adjacent to the source/drain regions sdn and sdp. This is because the source/drain regions sdn and sdp to be a base body are formed such that their sidewalls have the forward tapered shape in the manufacturing method according to the first embodiment as described at the step of FIG. 5. When the sidewall insulating films IS are formed so as to cover the sidewalls of the source/drain regions sdn and sdp having such a forward tapered shape, the sidewalls are processed so as to have the forward tapered shape in a self-aligning manner when etch back is performed to the second sidewall insulating films IS2 by anisotropic etching.

Generally, when a spacer-shaped sidewall film is formed by etch back, an edge portion of the sidewall film has a curved surface unless the etching is completely anisotropic. On the other hand, in the manufacturing method according to the first embodiment, the sidewall insulating film IS is formed so as to have a more gentle inclination of the forward tapered shape as described above. In the manufacturing method according to the first embodiment, effects on a manufacturing process of forming the sidewall insulating film IS having the inclination as described above will be described in detail later.

Figure 12:
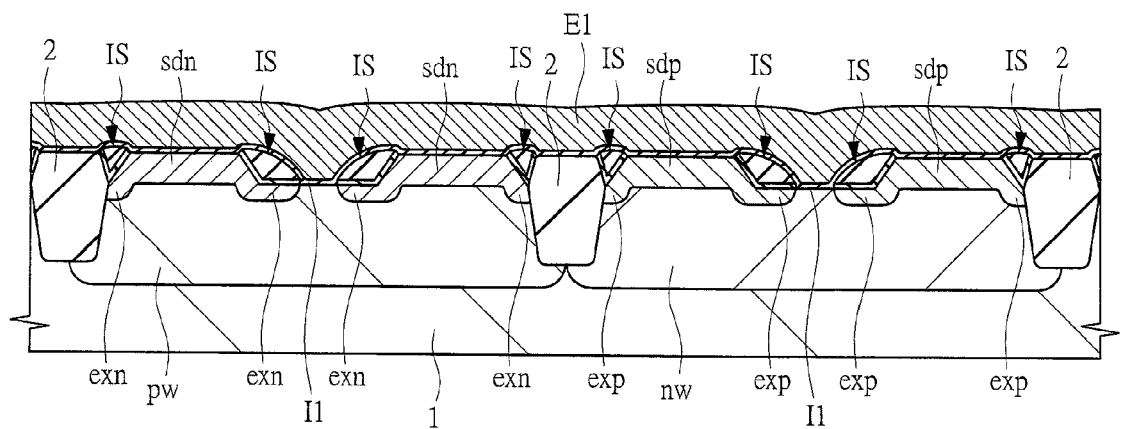
FIG. 12 is a sectional view of the principal part of the semiconductor device in the manufacturing process thereof continued from FIG. 11.

Next, as shown in FIG. 12, a first insulating film I1 and a first conductor film El are sequentially formed on the whole surface of the silicon substrate 1. The first insulating film I1 and the first conductor film E1 are materials to be a gate insulating film IG and a gate electrode GE (see FIG. 1 described above), respectively, by processing later.

As the first insulating film Il, an insulating film mainly made of silicon oxide, silicon oxynitride, silicon nitride, tantalum oxide, titanium oxide, aluminum oxide, hafnium oxide, or hafnium silicon oxynitride is formed. As the first insulating film I1 to be the gate insulating film IG later, it is more preferable to use an insulating film having a dielectric constant higher than that of silicon oxide rather than an insulating film mainly made of silicon oxide. The reason and effect are the same with the description with reference to FIG. 1.

As the first conductor film E1, it is more preferable to use so-called metal gate electrode material using a conductive film mainly made of polysilicon, titanium nitride, molybdenum nitride, hafnium silicide, or the like containing impurities. The reason and effect of this are to the same with the description with reference to FIG. 1.

Figure 13:
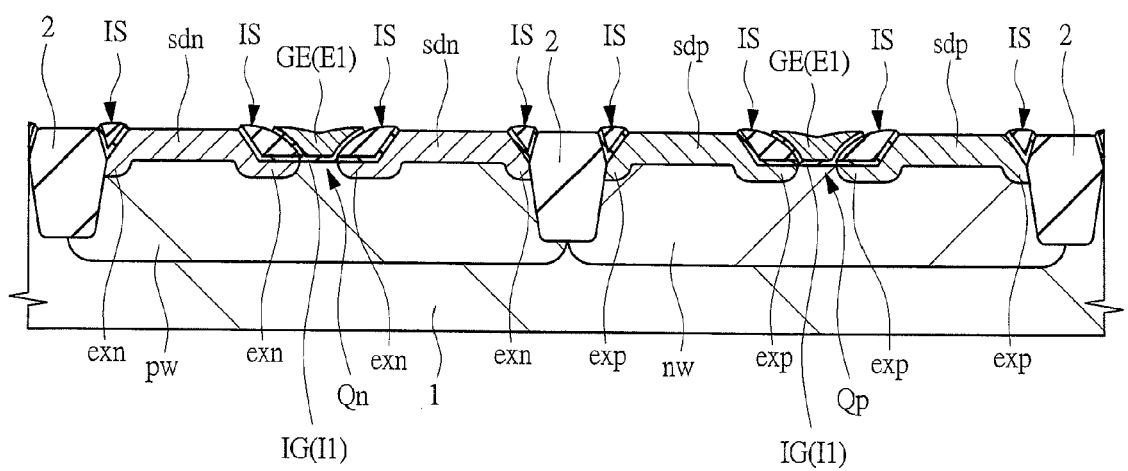
FIG. 13 is a sectional view of the principal part of the semiconductor device in the manufacturing process thereof continued from FIG. 12.

Next, as shown in FIG. 13, the gate insulating film IG and the gate electrode GE are sequentially formed at a position between the pair of n-type source/drain regions sdn (p-type source/drain regions sdp) and sandwiched by sidewall insulating films IS on the main surface of the silicon substrate 1. At this step, the first insulating film I1 and the first conductor film E1 sequentially formed so as to cover the main surface of the silicon film 1 are made to remain at a position sandwiched by the sidewall insulating films IS in the plane, and are made to remove portions other than the remained portion, so that the gate insulating film IG formed of the first insulating film I1 and the gate electrode GE formed of the first conductor film E1 are formed so as to have the shapes as described above. Thus, in the manufacturing method according to the first embodiment, the first insulating film I1 and the first conductor film E1 are buried in the trench-shaped portion formed by the source/drain regions sdn and sdp and the sidewall insulating films IS, so that the gate insulating films IG and the gate electrodes GE are formed. This process is the so-called damascene process.

At this time, the gate insulating films IG and the gate electrodes GE are formed at the substantially same position as the dummy gate insulating film D1 and the dummy gate electrode D2 formed at the step of FIG. 3 described above. More specifically, the source/drain regions sd are selectively formed at positions which are not covered by the dummy gate electrode D2, sidewall insulating films IS are formed on sidewalls of the source/drain regions sd, and the gate insulating film IG and the gate electrode GE are formed in a region separated by the sidewall insulating films IS. Accordingly, the gate electrode GE is formed at a position where the dummy gate electrode D2 is arranged in a self-aligning manner. A difference in size between the gate electrode GE and the dummy gate electrode D2 is a difference in size between the dummy sidewall insulating film D3 and the sidewall insulating film IS. In this manner, such a structure is formed that the extension regions exn and exp are positioned from the lateral lower portions of the gate electrodes GE to positions overlapping with end portions of the source/drain regions sdn and sdp on a plane by forming the gate insulating films IG and the gate electrodes GE.

Here, when the first insulating film I1 and the first conductor film E1 are buried in the trench-shaped portion separated by the sidewall insulating films IS and other portions of the trench-shaped portion are removed, a chemical mechanical polishing (CMP) method and the like may be used. On the other hand, in the manufacturing method according to the first embodiment, it is more preferable to process the first insulating film I1 and the first conductor film E1 so as to have the shapes as described above by etching. That is, at the step of FIG. 13 described above, the gate insulating films IG and the gate electrodes GE are formed by removing the first conductor film E1 and the first insulating film Il of portions other than portions sandwiched by the sidewall insulating films in the plane by etching. More specifically, first, the first conductor film E1 is etched back by anisotropic etching such as RIE method to bury the first conductor film E1 in the etched-back portion. Sequentially, the first insulating film I1 which is not covered by the first conductor film E1 is removed by wet etching. Thereby, the gate electrode GE and the gate insulating film IG can be formed without being mechanically damaged due to CMP. As a result, performance of the semiconductor device having the MIS transistor can be improved.

Here, in the case of forming the gate electrode GE in the above manner, a forming method of a lead-out electrode portion will be described with reference to FIGS. 14 to 16. In the plan views thereof, hatching is used for convenience. In the manufacturing method according to the first embodiment, the gate electrodes GE are formed in trenches between the source/drain regions sdn and sdp stacked on the silicon substrate 1, respectively. Accordingly, the trench is not formed on the isolating portion 2, and therefore, the gate electrode GE is disconnected at a portion where the gate electrode GE is extending across the isolating portion 2. That is, when such a situation is maintained, even if the lead-out portion to be electrically connected to the gate electrode GE is provided outside the device region, the lead-out portion and the gate electrode GE cannot be electrically connected to each other.

Compared to this, in the manufacturing method according to the first embodiment, the electrical connection between the lead-out portion and the gate electrode GE is achieved in the following manner.

Figure 14:
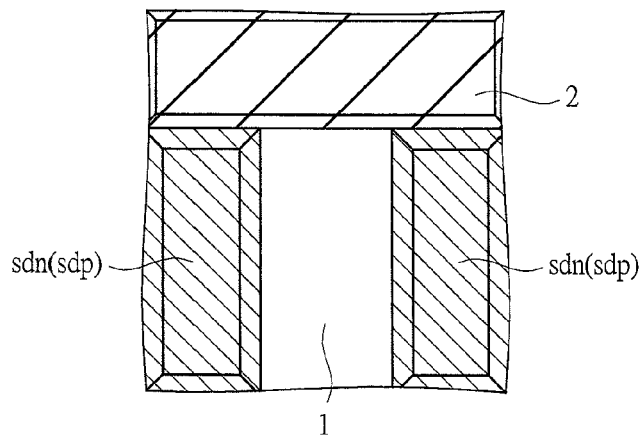
FIG. 14 is a sectional view of the principal part of the semiconductor device according to the first embodiment of the present invention in the manufacturing process thereof, the manufacturing process corresponding to FIG. 9.
Figure 15:
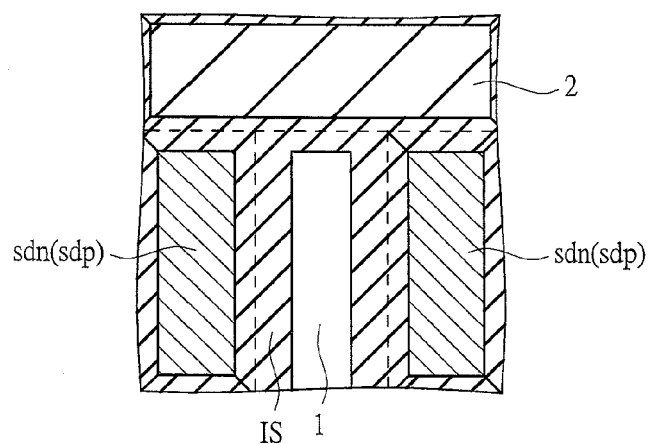
FIG. 15 is a sectional view of the principal part of the semiconductor device in the manufacturing process thereof continued from FIG. 14, the manufacturing process corresponding to FIG. 10.

At the step of FIG. 9 described above, when a state where the dummy gate electrode D2 and the like have been removed is viewed in the plane, there are provided the source/drain regions sdn and sdp, the isolating portion 2, and the silicon substrate 1 as shown in FIG. 14. Thereafter, as shown in FIG. 15 corresponding to the sectional view of FIG. 11, the sidewall insulating film IS is formed so as to cover sidewalls of the source/drain regions sdn and sdp. At this step, the silicon substrate 1 is exposed between the sidewall insulating films IS facing to each other in the view on the plane. The gate insulating film IG and the gate electrode GE are formed on the exposed portion in later steps (FIGS. 12 and 13, and the like).

Figure 16:
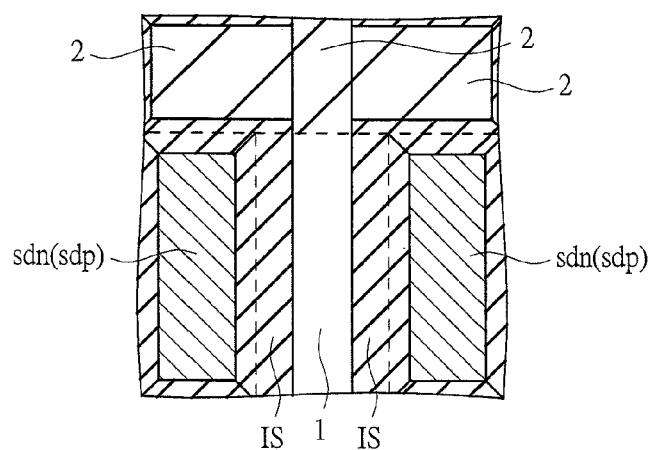
FIG. 16 is a sectional view of the principal part of the semiconductor device in the manufacturing process thereof continued from FIG. 15.

Thereafter, as shown in FIG. 16, such a trench as to extend the trench between the sidewall insulating films is formed on an upper surface of the isolating portion 2 by photolithography method, anisotropic etching method, and the like. Thereby, when the gate electrode GE is formed by depositing the first conductor film E1 and performing the etch back thereto in the later step, the first conductor film E1 is buried in the trench on the isolating portion 2. Therefore, the gate electrode GE can be lead out to the outside of the device region without being disconnected on the isolating portion 2. Note that, as long as at least the first conductive film on the isolating portion 2 is electrically connected to the gate electrode GE, a width of the first conductive film is not required to have the same width of the gate electrode GE. In other word, the trench formed on the upper surface of the isolating portion 2 may be wider than the trench between the sidewall insulating films IS facing to each other.

At the above steps, the basic configuration of the n-type MIS transistor Qn and the p-type MIS transistor Qp are formed on the silicon substrate 1. Further, at the next step, it is more preferable to form metal silicide layers sc on part of surface sides of the source/drain regions sdn and sdp. The reason is as described with reference to FIG. 1.

The metal silicide layers sc are formed by so-called "salicide technique". First, a metal, for example, cobalt (Co), nickel (Ni), platinum (Pt), tungsten (W), or molybdenum (Mo) is deposited on the silicon substrate 1. Subsequently, by performing a heat treatment, chemical reaction (metal silicidation) is generated between the metal material and the silicon portion (source/drain regions sdn and sdp in the first embodiment) exposed on the silicon substrate 1, so that a metal silicide (cobalt silicide, nickel silicide, platinum silicide, tungsten silicide, molybdenum silicide, or the like) is formed. Thereafter, portions of metal films in which silicide reaction has not generated are removed by etching to form the metal silicide layers sc.

Figure 18:
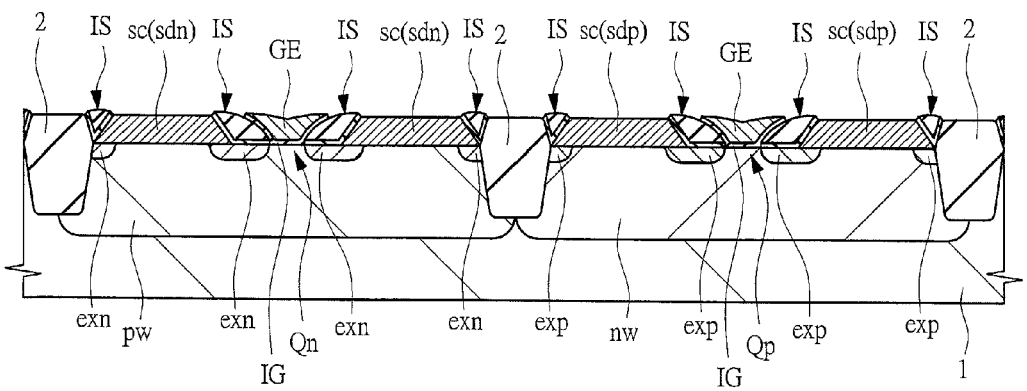
FIG. 18 is a sectional view of the principal part of the semiconductor device in another manufacturing process thereof continued from FIG. 13.

Also, metal silicide layers sc such as described above can be formed over all the source/drain regions sdn and sdp as shown in FIG. 18. In the following description, as assuming that the metal silicide layers sc are formed over all the source/drain regions sdn and sdp, the later steps will be described.

Further, in the step of forming the metal silicide layers sc in the above manner, segregation of impurities implanted in the source/drain regions sdn and sdp occurs in an interface of the silicon growth layer/the metal silicide layer sc due to invasion of the metal silicide reaction from surfaces of the source/drain regions sdn and sdp (snowplow effect). Therefore, an impurity concentration in the interface of silicon growth layer/the metal silicide layer sc becomes a high concentration (for example, $1 \times 10^{20}$ $cm^{-3}$ or larger). Thereby, a contact resistance between the silicon growth layer and the metal silicide layer sc within the source/drain regions sdn and sdp becomes a sufficiently low value which does not affect high-speed operation of the MIS transistor. The same holds true to the case of forming the source/drain regions sdn and sdp by stacking the mixed crystal layer of silicon and germanium.

Note that the impurity concentrations of the extension regions exn and exp become lower than those of the source/drain regions sdn and sdp by the snowplow effect described above.

Figure 19:
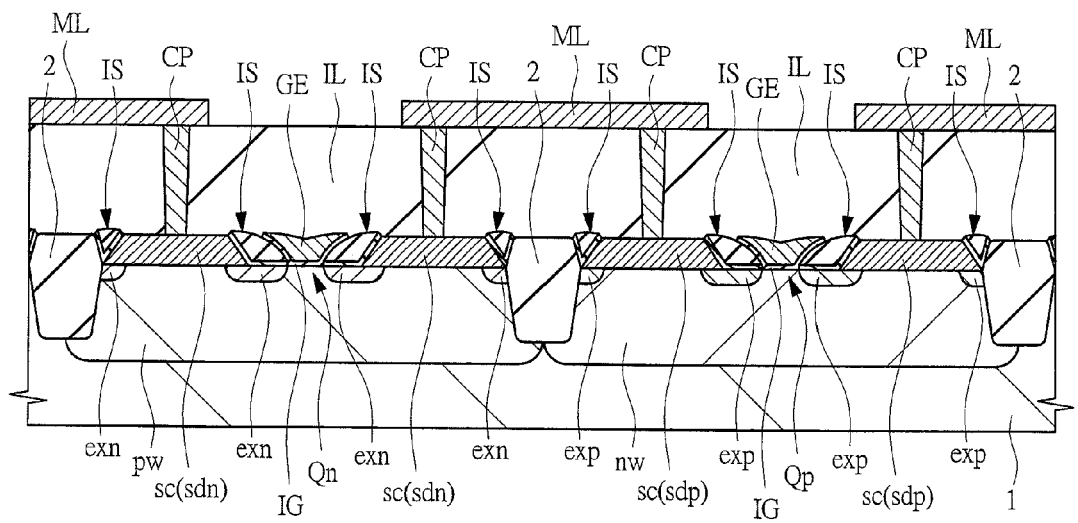
FIG. 19 is a sectional view of the principal part of the semiconductor device in the manufacturing process thereof continued from FIG. 18.

Next, as shown in FIG. 19, there is provided a wiring layer structure formed of the interlayer insulating film IL, the contact plug CP, and the wiring layer ML, which have the configuration described with reference to FIG. 1, by photography method, etching method, and the like. In the manufacturing method according to the first embodiment, the semiconductor device having the structure shown in FIG. 1 is formed by the above-described steps.

The above descriptions are for the manufacturing method of the semiconductor device having the MIS transistors Qn and Qp according to the first embodiment. Hereinafter, effects obtained by the above-described configuration of the manufacturing method according to the first embodiment will be described in detail.

First, according to the manufacturing method of the first embodiment, the gate insulating films IG and the gate electrodes GE are formed after the formation of the source/drain regions sdn and sdp and the extension regions exn and exp. That is, the heat treatment to the source/drain regions sdn and sdp and the extension regions exn and exp can be performed before the formation of the gate insulating films IG and gate electrodes GE. Therefore, even when the high-K insulating film is used as the gate insulating film IG and even when the metal gate material is used as the gate electrode GE, influence of the heat treatment thereon can be reduced. Thereby, degradation of device characteristic such as the increase of gate leakage current and the change of flat band voltage can be reduced.

Also, according to the manufacturing method of the first embodiment, a size of the silicon substrate 1 exposed on the opening portion of the sidewall insulating film IS becomes the gate length of the gate electrode GE. And, processing of the sidewall insulating film IS is performed by etch back of anisotropic etching regardless the shape processing such as photolithography method. That is, the gate length of the gate electrode GE can be set regardless of the minimum feature size of the photolithography method. More specifically, the gate length becomes long when the thickness of the sidewall insulating film IS is thin, and the gate length becomes short when the thickness of the sidewall insulating film IS is thick. In other words, the gate length can be arbitrarily changed by selecting the film thickness of the sidewall insulating film IS. And, according to verification by the present inventors, it is possible to set the gate length determined by the distance between the sidewall insulating films IS facing to each other to 32 nm or shorter. Thus, a semiconductor device provided with the MIS transistor having the short gate length can be formed.

Further, in the manufacturing method according to the first embodiment, since the source/drain regions sdn and sdp are formed so as to have the inclination as described above, the gentler inclination of the forward tapered shape is also formed on the sidewall of the sidewall insulating film IS to be formed on the source/drain regions sdn and sdp. Thus, since the sidewall insulating film IS has the inclination of the forward tapered shape, a cavity such as a void is hardly formed in the manufacturing method according to the first embodiment upon burying the first conductor film E1. This is because, since the sidewall surfaces of the region surrounded by the sidewall insulating films IS to be a target portion, in which the first conductor film E1 is to be buried, have the inclination of the forward tapered shape, an opening portion is wider at an upper portion thereof, and therefore, it is easy to bury the film. Thereby, occurrence of the void in the gate electrode GE is reduced, so that a semiconductor device having a MIS transistor can be formed without degrading characteristics such as ON/OFF characteristic.

As described above, in a MIS transistor having a high-K/metal gate structure, by employing the manufacturing method according to the first embodiment in the damascene gate process technique which can reduce the influence of the heat treatment and make the gate length shorter, there can be provided the manufacturing method in which the burying property of the gate electrode GE is improved and the cavity such as a void hardly occurs. Thereby, a gate length of a MIS transistor can be further shortened without degrading characteristics of the MIS transistor such as ON/OFF characteristic. As a result, performance of the semiconductor device having the MIS transistor can be further improved.

Note that, in the viewpoint that the manufacturing method according to the first embodiment can achieve the gate length of the minimum feature size or shorter and can improve the burying property of the gate electrode GE, the manufacturing method can be also effectively applied to a manufacturing method of a MIS transistor which has a gate insulating film IG formed of a silicon oxide film and a gate electrode GE formed of a polysilicon film. Compared to this, since influence of heat treatment can be avoided in the above manner, the manufacturing method according to the first embodiment is effectively applied to a manufacturing method of a MIS transistor which has a gate insulating film IG formed of a high-K insulating film and a gate electrode GE formed of metal gate material.

Further, in the manufacturing method according to the first embodiment, as shown in FIG. 5, the dummy gate insulating film D1, the dummy gate electrode D2, and the first dummy sidewall insulating film D3 are formed. And, the source/drain regions sd are selectively formed by stacking semiconductor layers by crystal growth at portions of the silicon substrate 1 in regions which are not covered by a dummy structure formed of them. Thus, the source/drain regions sd can be formed in a self-aligning manner by forming the dummy structure in this manner.

Also, in the manufacturing method according to the first embodiment, as shown in FIGS. 7 and 8, the extension regions exn and exp are formed by the ion implantations D1 and D2. At this time, the dummy gate electrode D2 and the source/drain region sd serves as an ion implantation mask, and the extension regions exn and exp can be formed at desired positions on the silicon substrate 1 in a self-aligning manner.

In this manner in the manufacturing method according to the first embodiment, a characteristic structure as described above can be formed in a self-aligning manner by using the dummy structure formed of the dummy gate insulating film D1, the dummy gate electrode D2, and the first dummy sidewall insulating film D3 in this manner. This causes an effect of improvement of the processing accuracy. Also, this causes an effect of simplification of the manufacturing process. As a result, performance of the semiconductor device having the MIS transistor can be improved.

Further, in the semiconductor device according to the first embodiment and the manufacturing method thereof, the substrate on which MIS transistors Qn and Qp are formed has been described as the silicon substrate 1. Hereinafter, a technique in which an SOI (Silicon on Insulator) substrate is used for the substrate will be described in detail as another semiconductor device according to the first embodiment and a manufacturing method thereof.

Figure 20:
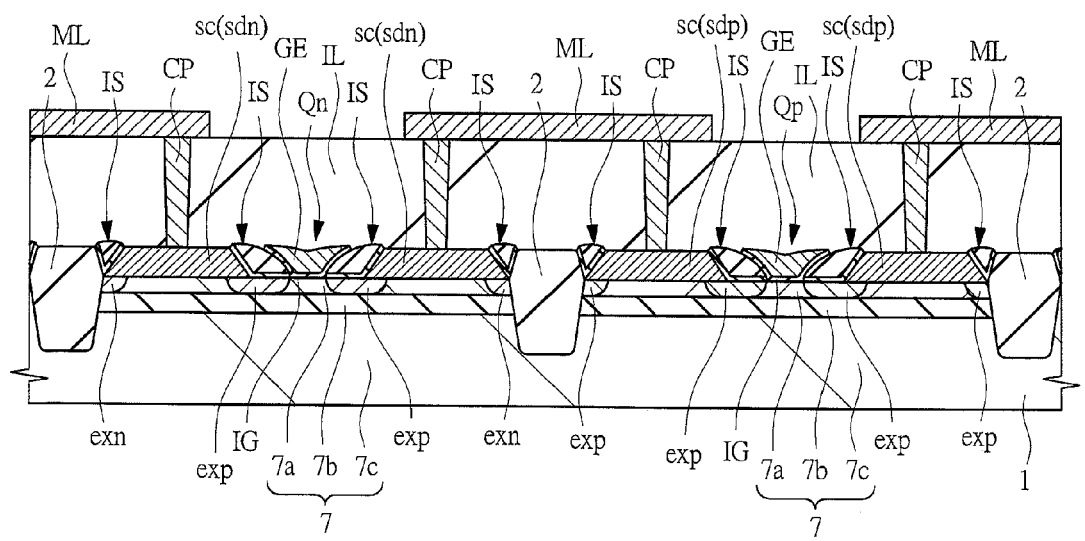
FIG. 20 is a sectional view of a principal part of another semiconductor device according to the first embodiment of the present invention.

FIG. 20 shows a structure in which the silicon substrate 1 shown in FIG. 1 is replaced by an SOI substrate (semiconductor substrate) 7 as another semiconductor device according to the first embodiment. A configuration shown in FIG. 20 is similar to the configuration shown in FIG. 1 except that the SOI substrate 7 is used as the substrate. The SOI substrate 7 includes an SOI layer 7a, a buried insulating layer 7b, and a supporting substrate 7c stacked in this order from a main surface side of the substrate. The SOI layer 7a is a semiconductor layer made of, for example, a silicon single crystal or the like. The buried insulating layer 7b is an insulating layer made of, for example, silicon oxide. The supporting substrate 7c is a thick substrate, for example, made of silicon single crystal and the like and supporting the above-described two layers. And, there is provided a structure in which components configuring the n-type MIS transistor Qn and the p-type MIS transistor Qp described in the above-described FIG. 1 are formed on the SOI layer 7a of the SOI substrate 7.

Figure 21:
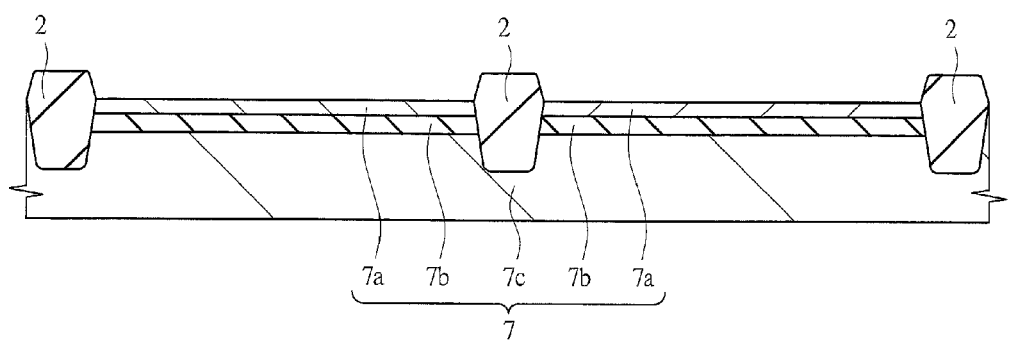
FIG. 21 is a sectional view of the principal part of the another semiconductor device according to the first embodiment of the present invention in a manufacturing process thereof.

Also, as a manufacturing method of a semiconductor device having such a structure, the silicon substrate 1 is replaced by the SOI substrate 7, and except for that, the same steps in the manufacturing method described with reference to FIGS. 2 to 19 are performed. More specifically, as shown in FIG. 21, the isolating portions 2 are formed on the SOI substrate 7 by the same step as the step described with reference to FIG. 2. In the subsequent steps, steps for, particularly, forming the n-type MIS transistor Qn and the p-type MIS transistor Qp are performed to the SOI layer 7a in the same manner as the manufacturing method described with reference to FIGS. 2 to 19, thereby forming a semiconductor device with a configuration shown in FIG. 20.

Effects obtained by employing the SOI substrate 7 as the substrate in the semiconductor device according to the first embodiment and the manufacturing method thereof will be described in detail below. Here, effects newly obtained by, particularly, employing the SOI substrate 7 will be described. Regarding the same configuration as the configuration described with reference to FIGS. 1 to 19, the same effects thereof are provided, and repetitive descriptions thereof are omitted here.

It is preferable to use the SOI substrate 7 because the MIS transistors Qn and Qp can be operated with low power. As a result, performance of the semiconductor device having MIS transistors can be further improved.

Also, from this viewpoint, when a film thickness of the SOI layer 7a is over 100 nm, the case of using the SOI substrate 7 is equal to the above-described case of using silicon substrate 1 in low power operation and high speed operation. On the other hand, when the film thickness of the SOI layer 7a is 3 nm or smaller, scattered carriers increase, so that reduction of the channel mobility becomes significant, thereby reducing the driving current. Therefore, it is more preferable to use such an SOI substrate 7 having the SOI layer 7a whose film thickness is 4 to 100 nm. Thereby, characteristics (sub-threshold characteristic) at a threshold voltage or lower is improved so that operations in lower power and higher speed can be performed. As a result, performance of the semiconductor device having MIS transistors can be further improved.

Further, as a film thickness of the buried insulating layer 7b exceeds 50 nm, back bias effect becomes small. On the other hand, when the film thickness of the buried insulating layer 7b is 2 nm or thinner, tunnel leakage current increases. Therefore, it is more preferable to use such an SOI substrate 7 having the buried insulating layer 7b whose film thickness is 3 to 50 nm. Thereby, a four-terminal MIS transistor using back bias control can be formed. In the four-terminal MIS transistor, such a circuit can be configured that decrease of OFF leakage current and improvement of ON current can be achieved and variation of the threshold voltages can be suppressed. As a result, performance of the semiconductor device having MIS transistors can be further improved.

Still further, it is more preferable to set the film thickness of the buried insulating layer 7b to 10 nm or smaller. This is because the short channel effect of the MIS transistors Qn and Qp can be more effectively controlled by this manner. As a result, the performance of the semiconductor device having MIS transistors can be further improved.

Second Embodiment

A semiconductor device according to a second embodiment will be described as comparing with the semiconductor device according to the first embodiment.

Figure 22:
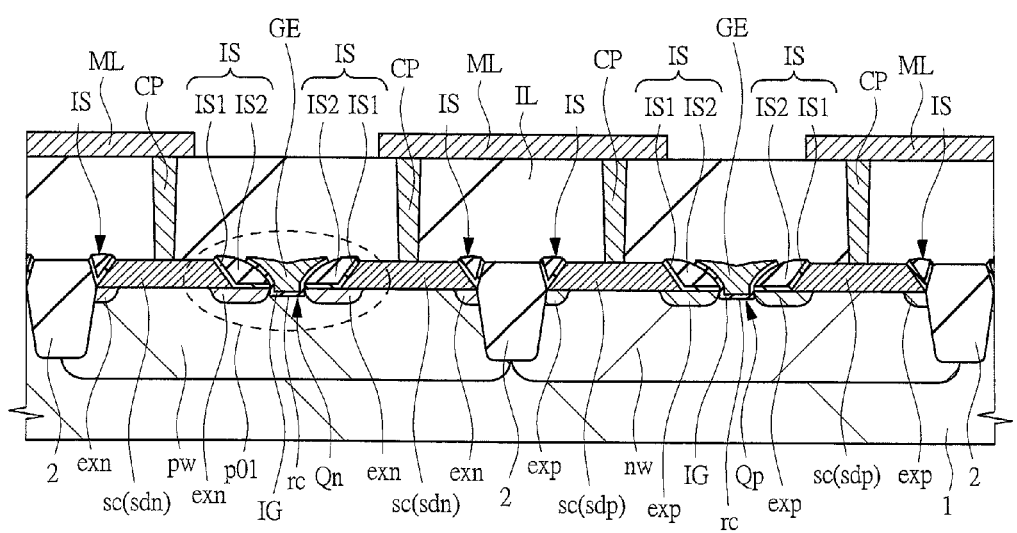
FIG. 22 is a sectional view of a principal part of a semiconductor device according to a second embodiment of the present invention.

As shown in FIG. 22, MIS transistors Qn and Qp of the semiconductor device according to the second embodiment have a structure different from that according to the first embodiment (see FIG. 1 described above) in a main portion p01 around a gate structure thereof. Note that, the semiconductor device according to the second embodiment has the same configuration as that of the semiconductor device according to the first embodiment except for a configuration described below and its effects are also same, and therefore, repetitive descriptions thereof will be omitted here.

Figure 23:
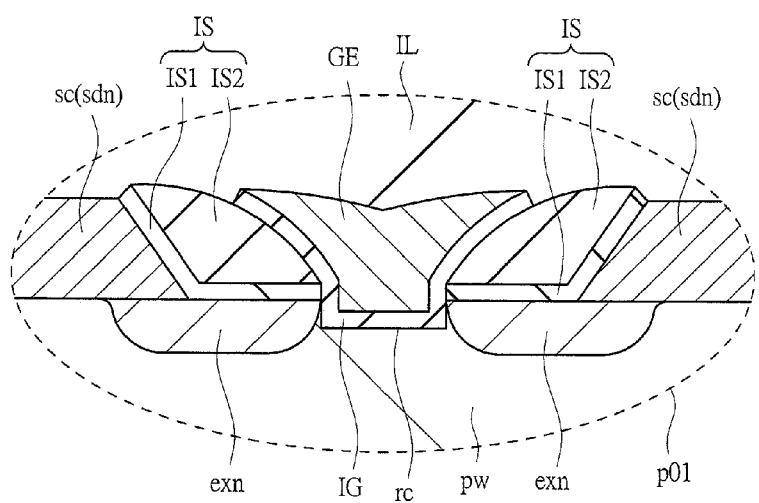
FIG. 23 is a partially enlarged view of the semiconductor device shown in FIG. 22.

FIG. 23 shows an enlarged view of the main portion p01 shown in FIG. 22. Although FIG. 23 shows the main portion p01 around the gate structure of, particularly, the n-type MIS transistor Qn, and the structure of the n-type MIS transistor Qn is described, the same holds true to the p-type MIS transistor Qp.

The n-type MIS transistor Qn of the semiconductor device according to the second embodiment includes a recess portion "rc" at a position where the gate electrode GE is formed interposing the gate insulating film IG on the main surface of the silicon substrate 1. That is, the main surface of the silicon substrate 1 according to the second embodiment includes a trench-shaped recess portion rc, which is positioned lower than the main surface of the silicon substrate 1 in a region other than the recess portion, at a position between the pair of n-type source/drain regions sdn and sandwiched by sidewall insulating films IS on a plane. In other words, the main surface of the silicon substrate 1 has a concave structure at the position sandwiched by the sidewall insulating films IS. And, the gate insulating film IG and the gate electrode GE of the n-type MIS transistor Qn of the semiconductor device according to the second embodiment are formed so as to cover the recess portion rc.

In this manner, since the semiconductor device according to the second embodiment has a structure including the recess portion rc in its gate structure, effects described below can be obtained. That is, since the extension regions exn and exp can be formed shallower, a structure which hardly causes the short channel effect can be obtained even if a gate interval (gate pitch) is narrow. Thereby, by using the MIS transistors Qn and Qp according to the second embodiment, operation in further low power consumption can be realized in the semiconductor device having the effects described in the first embodiment. As a result, performance of the semiconductor device having MIS transistors can be further improved.

Hereinafter, a manufacturing method of the semiconductor device having the effects as described above will be described. More particularly, a forming method of the gate structure having the recess portion rc described with reference to FIG. 23 will be described in detail. Steps which are not specifically described regarding the manufacturing method of the other configuration are same as those of the manufacturing method according to the first embodiment (FIGS. 2 to 19). Regarding effects obtained at each step of the manufacturing method according to the second embodiment, assuming that the same effects are provided if the steps are the same steps of the manufacturing method according to the first embodiment, repetitive descriptions thereof are omitted here.

First, in the manufacturing method according to the second embodiment, the same configuration is formed by the same steps as the steps described with reference to FIGS. 2 to 11.

Figure 24:
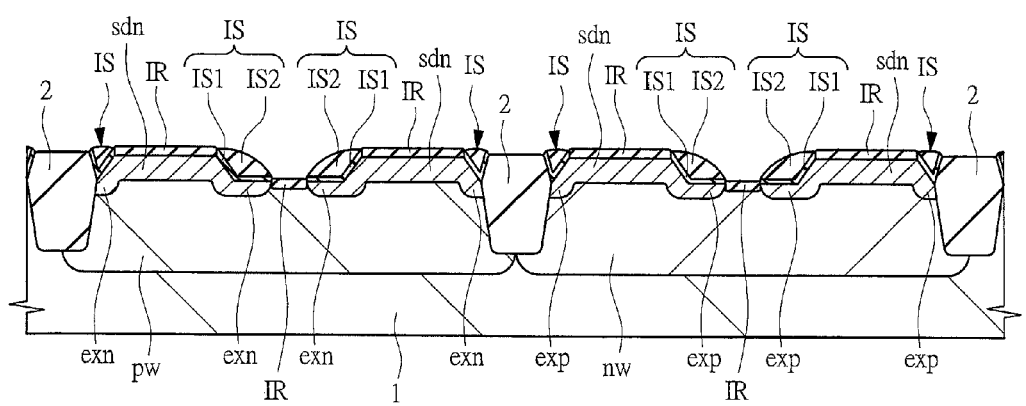
FIG. 24 is a sectional view of the principal part of the semiconductor device according to the second embodiment of the present invention in the manufacturing process thereof, the manufacturing process thereof continued from FIG. 11.

Next, as shown in FIG. 24, a silicon oxide film (an oxide film) "IR" is formed on the main surface of the silicon substrate 1 and a region inside the main surface sandwiched by the sidewall insulating films IS in the plane. At this step, the silicon oxide film IR formed of an insulating film mainly made of silicon oxide is formed on a surface of the silicon substrate 1 by using, for example, low-temperature and low-plasma oxidation method. Here, since the silicon oxide film IR is formed by oxidation of silicon, the silicon oxide film IR is formed at a portion where silicon is exposed on the main surface of the silicon substrate 1 in this step. That is, the silicon oxide film IR is formed on the main surface of the silicon substrate 1 and surfaces of the source/drain regions sdn and sdp sandwiched by the sidewall insulating films IS in the plane. Also, when the silicon oxide film IR is formed by the oxidation method, the oxide film grows in a region inside the main surface of the original silicon substrate 1 simultaneously with the oxide film growing on the main surface of the original silicon substrate 1. Accordingly, the silicon oxide film IR can be formed on the main surface of the silicon substrate 1 and the region inside the main surface thereof as described above.

Figure 25:
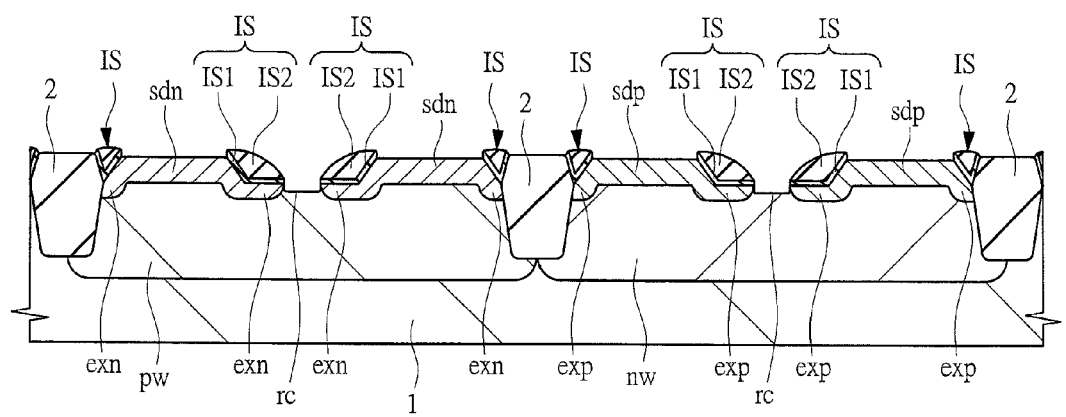
FIG. 25 is a sectional view of the principal part of the semiconductor device in the manufacturing process thereof continued from FIG. 24.

Next, the recess portion rc is formed by removing the silicon oxide film IR as shown in FIG. 25. At the step shown in FIG. 24, the silicon oxide film IR is also formed in the region inside the main surface of the silicon substrate 1. By removing such a silicon oxide film IR, the trench-shaped recess portion rc having the structure in which the main surface of the silicon substrate 1 in a channel portion is concave can be formed, as shown in FIG. 25. More specifically, the silicon oxide film IR is removed by performing wet etching using, for example, hydrofluoric acid aqueous solution and the like.

In the above manner, the trench-shaped recess portion rc, which is lower than the silicon substrate 1 in a region other than the recess portion, is formed at a position between the pair of source/drain regions sdn and sdp and sandwiched by the sidewall insulating films IS in the plane on the main surface of the silicon substrate 1 in the manufacturing method according to the second embodiment. In the manufacturing method according to the second embodiment, effects obtained by employing a method for forming the silicon oxide film IR and removing the same by wet etching to form the recess portion rc as described above will be described in detail later.

Figure 26:
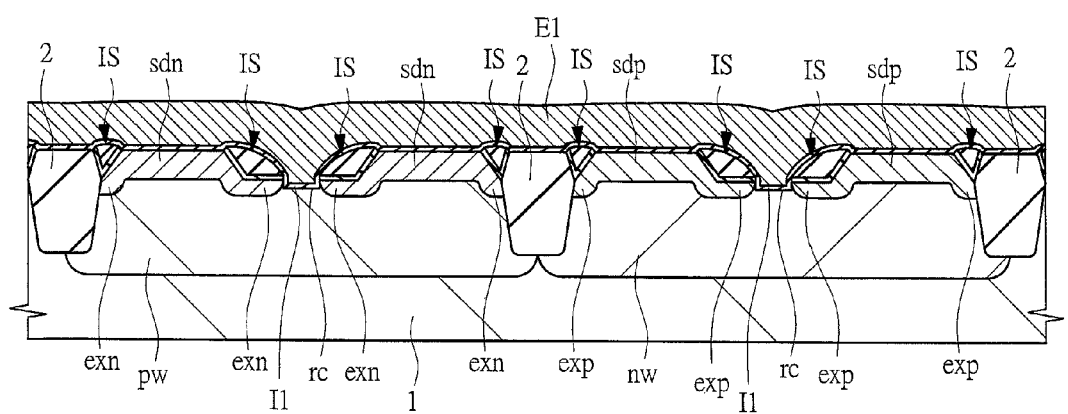
FIG. 26 is a sectional view of the principal part of the semiconductor device in the manufacturing process thereof continued from FIG. 25.

Next, as shown in FIG. 26, the first insulating film I1 and the first conductive film E1 which are same as those shown in FIG. 12 are formed by performing the same steps as those shown in FIG. 12. Here, the first insulating film I1 and the first conductive film E1 are formed so as to cover, particularly, even the recess portion rc.

Figure 27:
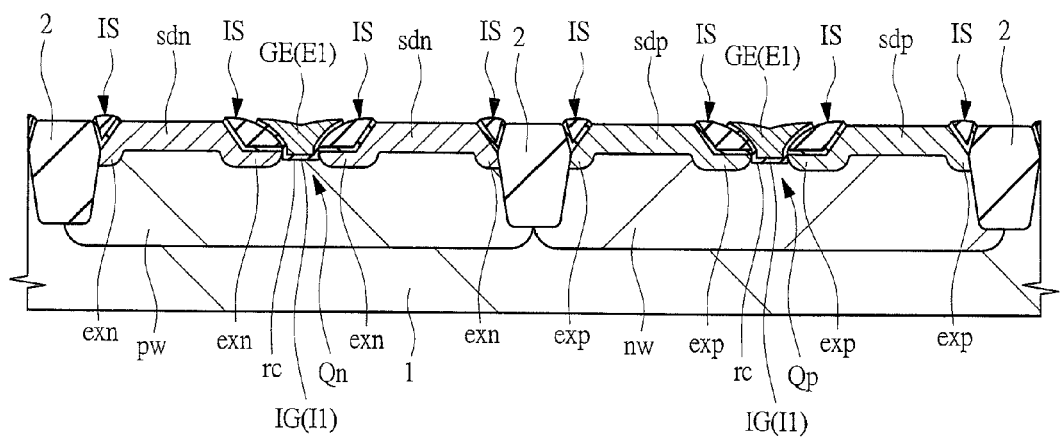
FIG. 27 is a sectional view of the principal part of the semiconductor device in the manufacturing process thereof continued from FIG. 26.

Next, as shown in FIG. 27, the first insulating film I1 and the first conductive film E1 are processed by performing the same step as that shown in FIG. 13 to form the gate insulating film IG and the gate electrode GE which are same as those shown in FIG. 13. Here, the gate insulating film IG and the gate electrode GE are formed so as to cover, particularly, the recess portion rc.

A basic structure of the MIS transistors Qn and Qp each having the recess portion rc having the above-described effects can be formed by the manufacturing method according to the second embodiment as described above.

Figure 17:
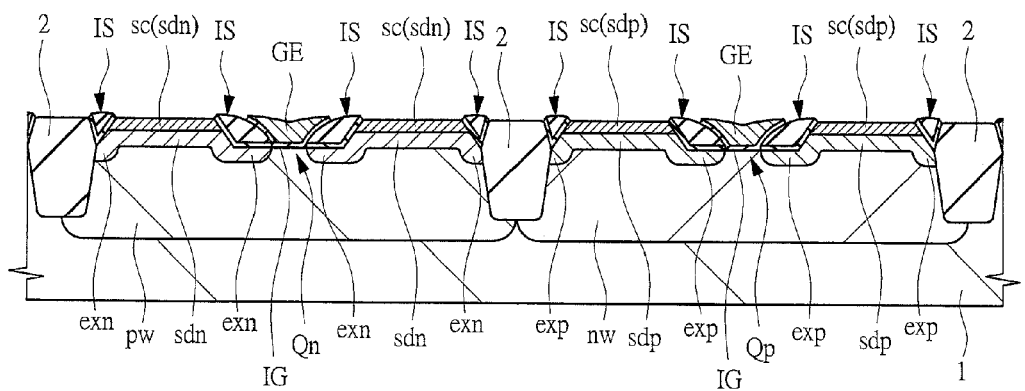
FIG. 17 is a sectional view of the principal part of the semiconductor device in the manufacturing process thereof continued from FIG. 13.
Figure 28:
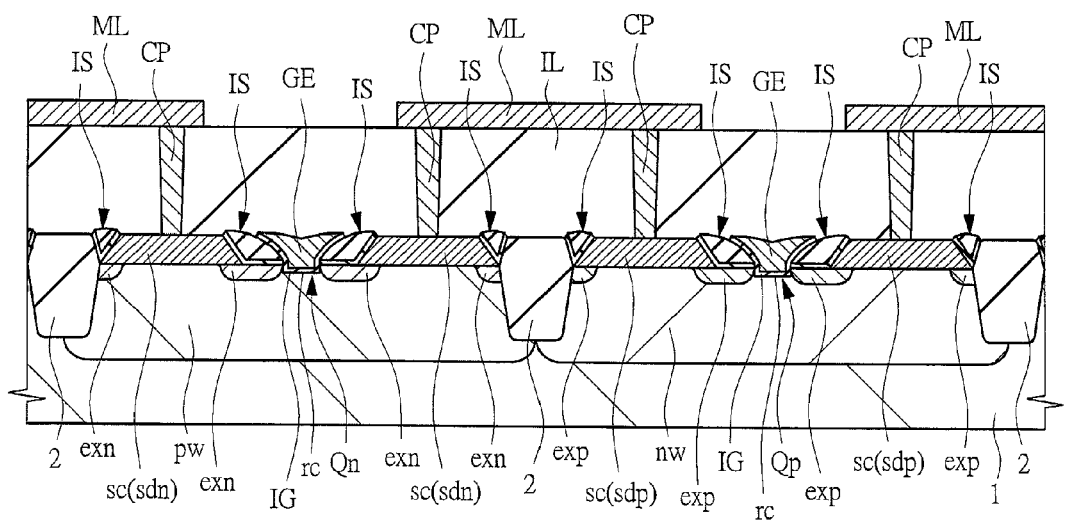
FIG. 28 is a sectional view of the principal part of the semiconductor device in the manufacturing process thereof continued from FIG. 27.

In subsequent steps, as shown in FIG. 28, the metal silicide layer sc, the interlayer insulating film IL, the contact plug CP, and the wiring layer ML which are same as those shown in FIGS. 17 to 19 are formed by performing the same steps as the steps described with reference to FIGS. 17 to 19. In the manufacturing method according to the second embodiment, a semiconductor device having the structure shown in FIG. 22 is formed by the above-described steps.

The above descriptions are for the manufacturing method of the semiconductor device having the MIS transistors Qn and Qp according to the second embodiment. Hereinafter, effects obtained by the above-described configuration of the manufacturing method according to the second embodiment will be described in further detail.

In the manufacturing method according to the second embodiment, the method for forming the recess portion rc as described in FIG. 22 has been described. For example, Non-Patent Document 1 discloses a method for forming a recess structure in a channel portion of a transistor by anisotropic dry etching. Also in the manufacturing method of the semiconductor device according to the second embodiment, the recess portion rc may be formed by anisotropic dry etching. Meanwhile, in the manufacturing method of the semiconductor device according to the second embodiment, it is more preferable to form the recess portion rc by forming the silicon oxide film IR and removing the same by wet etching as the steps shown in FIGS. 24 and 25. A reason thereof will be described below.

According to the manufacturing method based upon the above-described Non-Patent Document 1, an etching mask different from an etching mask for forming the gate structure must be used in order to form the recess portion rc by anisotropic etching. That is, influence of variations of the gate size and the impurity concentration to transistor characteristics is large since the manufacturing method does not depend on a self-aligning process. More particularly, according to studies by the present inventors, it is difficult to use the manufacturing method to a microfabrication device whose channel length is 45 nm or shorter. Also, generally, anisotropic etching damages a surface of its target material. A surface of the recess structure formed by the steps is a part of the channel region of the MIS transistor. When the channel region is damaged in this manner, the damage becomes causes of the reduction of the driving current and the increase of characteristic variations.

Compared to this, in the manufacturing method according to the second embodiment, the recess portion rc is formed by removing the silicon oxide film IR formed in a self-aligning manner. Further, as removing means of the silicon oxide film IR, isotropic etching by wet etching is employed. Thereby, degradation of characteristics of the MIS transistor such as variations of the gate size and the impurity concentration, and reduction of the driving current and variations of characteristics can be improved. As a result, performance of the semiconductor device having MIS transistors can be further improved.

Figure 29:
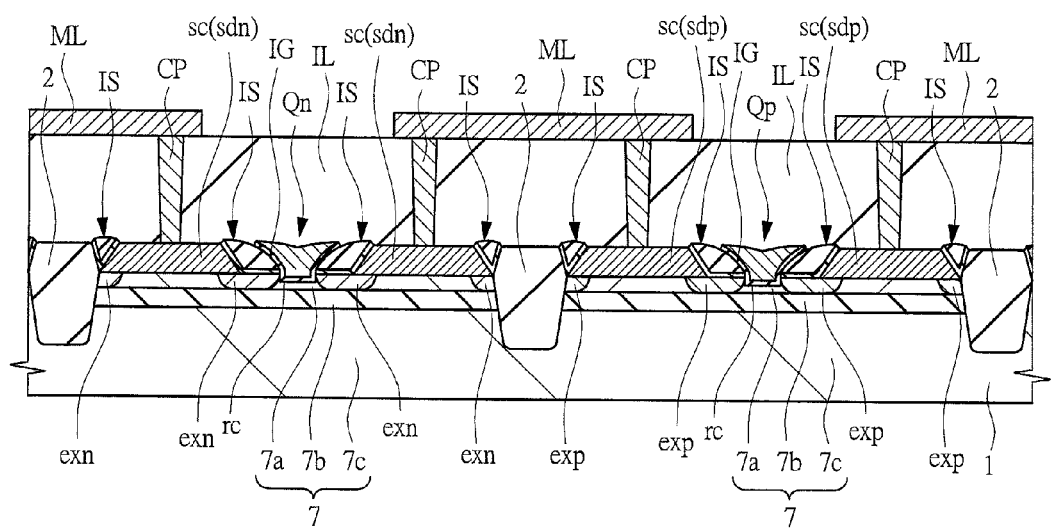
FIG. 29 is a sectional view of a principal part of another semiconductor device according to the second embodiment of the present invention.

Also, in the semiconductor device according to the second embodiment and the manufacturing method thereof, it is more preferable to use the SOI substrate 7 similar to that shown in FIG. 20 as the semiconductor substrate. FIG. 29 shows the semiconductor device having the structure in which the silicon substrate 1 in the semiconductor device shown in FIG. 22 is replaced by the SOI substrate 7. First, in the semiconductor device according to the second embodiment, effects obtained by replacing the substrate by the SOI substrate 7 are similar to the effects described with reference to FIG. 22 as another semiconductor device according to the first embodiment.

Further, each of the MIS transistors Qn and Qp has the recess portion rc in the semiconductor device according to the second embodiment, and such a configuration is formed on the SOI substrate 7, so that the following effect can be obtained. That is, in the structure in which MIS transistors Qn and Qp each having the above-described recess portion rc are formed on the SOI substrate 7, the SOI layer 7a under the gate insulating film IG is made thinner, so that the channel region can be made thinner. Accordingly, the short channel effect can be suppressed and the leakage current can be reduced. As a result, performance of the semiconductor device having MIS transistors can be further improved.

Still further, also regarding the manufacturing method, the semiconductor device having the structure shown in FIG. 29 can be formed by performing the manufacturing method described in FIGS. 24 to 28 to the SOI substrate 7. This point is also similar to the descriptions made in the first embodiment. Componential steps configuring the manufacturing method have the effects similar to the effects described in FIGS. 24 to 28.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, a halo region may be formed after the steps of forming the extension regions exn and exp described in the above-described first and second embodiments (for example, steps shown in FIGS. 7 and 8, and the like). For forming the halo region, first, impurity ions to obtain n-type and p-type are angle-implanted, for example, with an accelerating voltage of 5 keV and a dose amount of about $1 \times 10^{13}$ cm$^{-2}$. Thereafter, the halo region can be formed by performing a heat treatment at a temperature of 1000° C. for about one second by, for example, RTA method and the like.

For example, each polarity of n-type and p-type of the semiconductor regions described in the first and second embodiments can be reversed.

Also, for example, in the semiconductor devices described in the first and second embodiments, the STI structure has been used for the isolating portion 2 for separating regions to form a plurality of devices to be formed on the same substrate. A so-called LOCOS (Local Oxidation of Silicon) structure can be used as the isolating portion 2.

The present invention can be applied to a semiconductor industry required for performing information processing in, for example, a personal computer, mobile equipment, and the like.

What is claimed is:

1. A semiconductor device comprising:
   (a) a pair of source/drain regions formed of a semiconductor layer and arranged on a main surface of a semiconductor substrate at a predetermined distance therebetween;
   (b) sidewall insulating films arranged to be adjacent to sidewalls of the source/drain regions;
   (c) a gate electrode arranged at a position between the pair of the source/drain regions and sandwiched by the sidewall insulating films via an interposed gate insulating film, in a cross-sectional view; and
   (d) first semiconductor regions formed in regions each extending from respective a position below and lateral to the gate electrode to a position overlapping with an end portion of a corresponding one of the source/drain regions in the cross-sectional view, wherein
   the first semiconductor regions are formed to be electrically connected to the source/drain regions,
   impurity concentrations of the first semiconductor regions are lower than impurity concentrations of the source/drain regions,
   each of said sidewalls of the source/drain regions has a shape such that a height thereof from the semiconductor substrate becomes lower toward an end portion thereof, and
   each of the sidewall insulating films has a sidewall which is adjacent to the gate insulating film and the gate electrode, and which has a shape such that a height thereof from the semiconductor substrate becomes lower toward an end portion thereof,
   a trench-shaped recess portion is disposed at a position between the pair of source/drain regions and sandwiched by the sidewall insulating films in the cross-sectional view,
   the gate insulating film and the gate electrode are formed to cover the recess portion,
   a dielectric constant of the gate insulating film is higher than that of silicon oxide,
   the gate electrode is formed of a conductor film mainly made of titanium nitride, molybdenum nitride, or hafnium silicide, and
   each of the source/drain regions is formed of a semiconductor layer mainly made of a mixed crystal of silicon and germanium.

2. The semiconductor device according to claim 1, wherein a partial or whole surface of each of the source/drain regions is formed of a metal silicide layer.

3. The semiconductor device according to claim 2, wherein each of the sidewall insulating films has a stacked layer structure formed of a first sidewall insulating film and a second sidewall insulating film arranged in this order from a lower layer, and
a dielectric constant of the first sidewall insulating film is equal to or lower than a dielectric constant of the second sidewall insulating film.

4. The semiconductor device according to claim 3, wherein the semiconductor substrate includes an SOI layer, a buried insulating layer, and a supporting substrate arranged in this order from a side of the main surface, and
the configurations of (a) to (d) are formed on the SOI layer of the semiconductor substrate.

5. The semiconductor device according to claim 4, wherein a thickness of the SOI layer of the semiconductor substrate is 4 to 100 nm.

* * * * *